US011996143B2

(12) United States Patent
Nakagawa et al.

(10) Patent No.: US 11,996,143 B2
(45) Date of Patent: May 28, 2024

(54) SEMICONDUCTOR MEMORY DEVICE

(71) Applicant: KIOXIA CORPORATION, Tokyo (JP)

(72) Inventors: Tomoki Nakagawa, Yokohama Kanagawa (JP); Koji Kato, Yokohama Kanagawa (JP); Toshifumi Hashimoto, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/846,889

(22) Filed: Jun. 22, 2022

(65) Prior Publication Data
US 2022/0319590 A1 Oct. 6, 2022

Related U.S. Application Data

(63) Continuation of application No. 17/184,986, filed on Feb. 25, 2021, now Pat. No. 11,393,525.

(30) Foreign Application Priority Data

Sep. 17, 2020 (JP) ................. 2020-156299

(51) Int. Cl.
G11C 16/30 (2006.01)
G11C 5/14 (2006.01)
G11C 11/56 (2006.01)
G11C 16/04 (2006.01)
G11C 16/26 (2006.01)

(52) U.S. Cl.
CPC ............ G11C 11/5642 (2013.01); G11C 5/14 (2013.01); G11C 11/5671 (2013.01); G11C 16/0483 (2013.01); G11C 16/26 (2013.01); G11C 16/30 (2013.01)

(58) Field of Classification Search
CPC ... G11C 5/14; G11C 11/5642; G11C 11/5671; G11C 16/0483; G11C 16/26; G11C 16/30
See application file for complete search history.

(56) References Cited

U.S. PATENT DOCUMENTS

| 9,305,648 | B2 | 4/2016 | Nguyen et al. |
| 9,853,041 | B2 | 12/2017 | Shim |
| 11,101,005 | B2 * | 8/2021 | Maejima ................ G11C 16/32 |
| 2011/0297912 | A1 | 12/2011 | Samachisa et al. |
| 2018/0240515 | A1 | 8/2018 | Shibata et al. |
| 2019/0043591 | A1 | 2/2019 | Fastow et al. |
| 2019/0392894 | A1 | 12/2019 | Zhao et al. |

* cited by examiner

Primary Examiner — Son L Mai
(74) Attorney, Agent, or Firm — Kim & Stewart LLP

(57) ABSTRACT

A semiconductor memory device includes a plurality of memory cells, a word line connected to gates of the memory cells, a bit line electrically connected to one ends of the memory cells through a plurality of select gate transistors, respectively, the select gate transistors including two outer select gate transistors and one or more inner select gate transistors between the two outer select gate transistors, two outer select gate lines connected to gates of the two outer select gate transistors, respectively, one or more inner select gate lines connected to gates of the one or more inner select gate transistors, respectively, and a voltage generation circuit configured to independently control supply of voltages to the outer select gate lines and the inner select gate lines during an operation to read data stored in the memory cells.

11 Claims, 14 Drawing Sheets

SEMICONDUCTOR MEMORY DEVICE

CROSS-REFERENCE TO RELATED APPLICATION

This application is a continuation of U.S. patent application Ser. No. 17/184,986, filed Feb. 25, 2021, which is based upon and claims the benefit of priority from Japanese Patent Application No. 2020-156299, filed on Sep. 17, 2020, the entire contents of which are incorporated herein by reference.

FIELD

Embodiments described herein relate generally to a semiconductor memory device.

BACKGROUND

Recently, in a semiconductor memory device such as a NAND flash memory, a three-dimensional structure has been developed to achieve reduction in size and high capacity. In addition, in the NAND flash memory, a memory cell transistor may be programmed as a single level cell (SLC) capable of storing 1-bit (binary) data, a multi level cell (MLC) capable of storing 2-bit (quaternary) data, a triple level cell (TLC) capable of storing 3-bit (octal) data, or a quad level cell (QLC) capable of storing 4-bit (hexadecimal) data.

When data is read from a memory cell transistor, it is necessary to prepare voltages having multiple levels to be supplied to the memory cell transistor, and to switch between the voltages. In order to improve the read rate, it is necessary to increase the speed of transition to a desired target voltage.

DETAILED DESCRIPTION

Embodiments provide a semiconductor memory device that is configured to perform a read operation at higher speeds by independently controlling voltages supplied to outer select gate lines and inner select gate lines.

In general, according to one embodiment, there is provided a semiconductor memory device including a plurality of memory cells, a word line connected to gates of the memory cells, a bit line electrically connected to one ends of the memory cells through a plurality of select gate transistors, respectively, the select gate transistors including two outer select gate transistors and one or more inner select gate transistors between the two outer select gate transistors, two outer select gate lines connected to gates of the two outer select gate transistors, respectively, one or more inner select gate lines connected to gates of the one or more inner select gate transistors, respectively, and a voltage generation circuit configured to independently control supply of voltages to the outer select gate lines and the inner select gate lines during an operation to read data stored in the memory cells.

Hereinafter, an embodiment will be described in detail with reference to the drawings.

First Embodiment

In the embodiment, when applying an overdrive voltage that is higher than a desired target voltage to each of different types of select gate lines, by changing a resistance value within a driver circuit depending on the types of the select gate lines, the resulting voltages applied to the respective select gate lines can be made uniform, and an operation can be performed within a short period of time.

Configuration of Memory System

Figure 1:
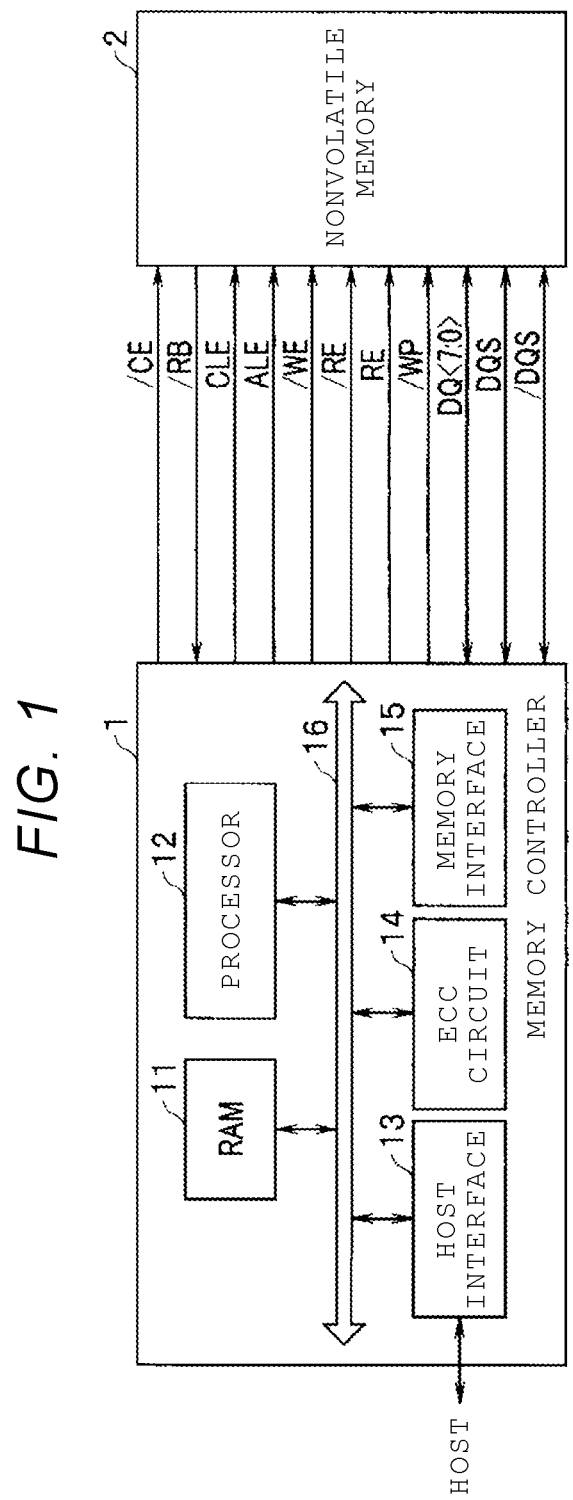
FIG. 1 is a block diagram illustrating a configuration example of a memory system according to an embodiment.

FIG. 1 is a block diagram illustrating a configuration example of a memory system according to the embodiment. The memory system according to the embodiment includes a memory controller 1 and a nonvolatile memory 2. The memory system can be connected to a host. The host is, for example, an electronic apparatus such as a personal computer or a mobile terminal.

The nonvolatile memory 2 is a semiconductor memory device that stores data in a nonvolatile manner and includes, for example, a NAND flash memory. In the embodiment illustrated herein, the nonvolatile memory 2 is a NAND memory including memory cell transistors each of which can store 3 bits, that is, a 3-bit/cell (TLC: Triple Level Cell)

NAND memory. However, the embodiment is not limited to this configuration. The nonvolatile memory 2 also has a three-dimensional structure.

The memory controller 1 controls writing of data into the nonvolatile memory 2 in accordance with a write request from the host. In addition, the memory controller 1 controls reading of data from the nonvolatile memory 2 in accordance with a read request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other through an internal bus 16.

The host interface 13 outputs a request received from the host, write data as user data, and the like through the internal bus 16. In addition, the host interface 13 transmits user data read from the nonvolatile memory 2, a response from the processor 12, and the like to the host.

The memory interface 15 controls writing of the user data or the like into the nonvolatile memory 2 and reading of the user data or the like from the nonvolatile memory 2 based on an instruction of the processor 12.

The processor 12 controls the memory controller 1. The processor 12 is, for example, a central processing unit (CPU) or a micro processing unit (MPU). When the processor receives a request from the host through the host interface 13, the processor 12 executes a control in accordance with the request. For example, the processor 12 instructs the memory interface 15 to write the user data and parity into the nonvolatile memory 2 in accordance with a request from the host. In addition, the processor 12 instructs the memory interface 15 to read the user data and parity from the nonvolatile memory 2 in accordance with a request from the host.

The processor 12 determines a storage area (hereinafter, referred to as "memory area") in the nonvolatile memory 2 for the user data stored in the RAM 11. The user data is stored in the RAM 11 through the internal bus 16. The processor 12 determines the memory area for data in units of pages (referred to herein as page data), where a page is a unit of writing. In the embodiments described herein, user data stored in one page of the nonvolatile memory 2 is defined to be unit data. The unit data is stored in the nonvolatile memory 2 as, for example, an encoded code word.

Encoding is not required. The memory controller 1 may store the unit data in the nonvolatile memory 2 without encoding the unit data. FIG. 1 illustrates a configuration in which the unit data is encoded. When the memory controller 1 does not execute encoding, page data matches with unit data. In addition, one code word may be generated based on one unit data, and one code word may be generated based on divided unit data. In addition, one code word may be generated using a plurality of unit data.

The processor 12 determines a memory area of the nonvolatile memory 2 into which each unit data is to be written. A physical address is assigned to the memory area of the nonvolatile memory 2. The processor 12 manages the memory area into which the unit data is to be written using the physical address. The processor 12 designates the determined physical address of the memory area and instructs the memory interface 15 to write the user data into the nonvolatile memory 2. The processor 12 manages a correspondence between a logical address of the user data (the logical address managed by the host) and the physical address. When the processor 12 receives a read request including the logical address from the host, the processor 12 specifies a physical address corresponding to the logical address, designates the physical address, and instructs the memory interface 15 to read the user data.

The ECC circuit 14 encodes the user data stored in the RAM 11 and generates a code word. In addition, the ECC circuit 14 decodes the code word read from the nonvolatile memory 2. The RAM 11 temporarily stores the user data received from the host until the user data is stored in the nonvolatile memory 2 or temporarily stores data read from the nonvolatile memory 2 until the data is transmitted to the host. The RAM 11 is, for example, a general-purpose memory such as a static random access memory (SRAM) or a dynamic random access memory (DRAM).

FIG. 1 illustrates a configuration example in which the memory controller 1 includes the ECC circuit 14 and the memory interface 15. However, the ECC circuit 14 may be built in the memory interface 15. In addition, the ECC circuit 14 may be built in the nonvolatile memory 2.

When the memory controller 1 receives a write request from the host, the memory controller 1 operates as follows. The processor 12 temporarily stores write data into the RAM 11. The processor 12 reads the data stored in the RAM 11 and inputs the read data into the ECC circuit 14. The ECC circuit 14 encodes the input data and transmits a code word to the memory interface 15. The memory interface 15 writes the input code word into the nonvolatile memory 2.

When the memory controller 1 receives a read request from the host, the memory controller 1 operates as follows. The memory interface 15 transmits a code word read from the nonvolatile memory 2 to the ECC circuit 14. The ECC circuit 14 decodes the input code word and stores the decoded data in the RAM 11. The processor 12 transmits the data stored in the RAM 11 to the host through the host interface 13.

Configuration of Nonvolatile Memory

Figure 2:
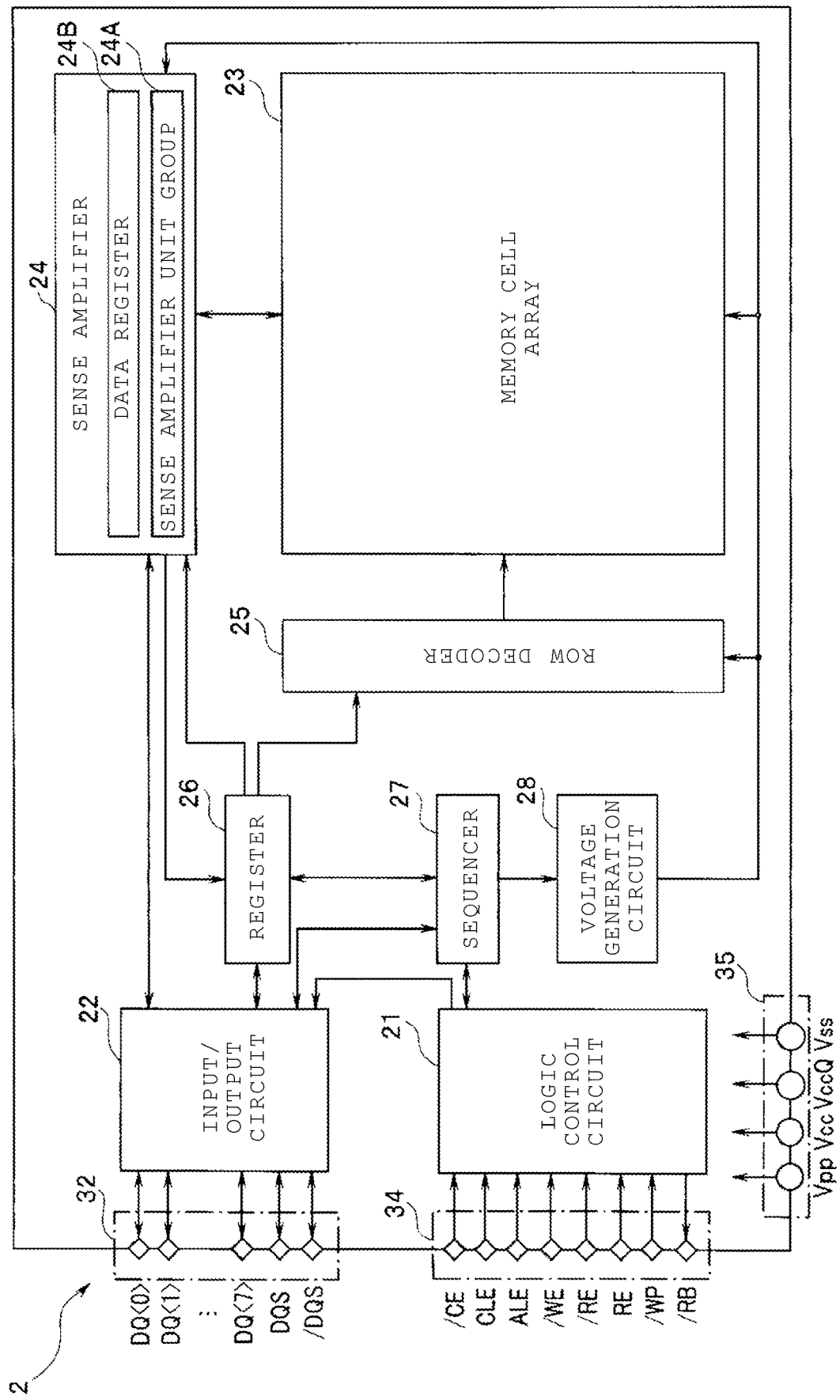
FIG. 2 is a block diagram illustrating a configuration example of a nonvolatile memory according to the embodiment.

FIG. 2 is a block diagram illustrating a configuration example of the nonvolatile memory according to the embodiment. The nonvolatile memory 2 includes a logic control circuit 21, an input/output circuit 22, a memory cell array 23, a sense amplifier 24, a row decoder 25, a register 26, a sequencer 27, a voltage generation circuit 28, a pad group for input/output 32, a pad group for logic control 34, and a terminal group for power input 35.

The memory cell array 23 includes a plurality of blocks. Each of the blocks BLK includes a plurality of memory cell transistors (memory cells). In the memory cell array 23, a plurality of bit lines, a plurality of word lines, a source line, and the like are provided in order to control voltages that are applied to the memory cell transistors. A specific configuration of the block BLK will be described below.

In order to transmit and receive respective signals including data to and from the memory controller 1, the pad group for input/output 32 includes a plurality of terminals (pads) corresponding to a signal DQ <7:0> and data strobe signals DQS and /DQS.

In order to transmit and receive respective signals to and from the memory controller 1, the pad group for logic control 34 includes a plurality of terminals (pads) corresponding to a chip enable signal /CE, a command latch enable signal CLE, an address latch enable signal ALE, a write enable signal /WE, read enable signals RE and /RE, and a write-protect signal /WP.

The signal /CE enables selection of the nonvolatile memory 2. The signal CLE indicates that a command is transmitted as the signal DQ and is to be latched in a command register. The signal ALE indicates that an address is transmitted as the signal DQ and is to be latched in an address register. The signal WE enables writing into the nonvolatile memory 2 using the signal DQ. The signal RE enables reading from the nonvolatile memory 2 using the signal DQ. The signal WP prevents writing and erasing in the nonvolatile memory 2. The signal R/B represents whether the nonvolatile memory 2 is in a ready state (state where the nonvolatile memory 2 can receive a command from an external apparatus) or in a busy state (state where the nonvolatile memory 2 cannot receive a command from an external apparatus). The memory controller 1 can recognize the state of the nonvolatile memory 2 by receiving the signal R/B.

In order to supply various operating voltages to the nonvolatile memory 2 from external apparatuses, the terminal group for power input 35 includes a plurality of terminals for inputting power supply voltages Vcc, VccQ, and Vpp and a ground voltage Vss. The power supply voltage Vcc is a circuit power supply voltage that is generally supplied from an external apparatus as an operating voltage. For example, a voltage of about 3.3 V is input. As the power supply voltage VccQ, for example, a voltage of 1.2 V is input. The power supply voltage VccQ is used when signals are exchanged between the memory controller 1 and the nonvolatile memory 2. The power supply voltage Vpp is higher than the power supply voltage Vcc. For example, a voltage of 12 V is input.

The logic control circuit 21 and the input/output circuit 22 are connected to the memory controller 1 through a NAND bus. The input/output circuit 22 transmits and receives the signals DQ (for example, DQ0 to DQ7) to and from the memory controller 1 through the NAND bus.

The logic control circuit 21 receives external control signals (for example, the chip enable signal /CE, the command latch enable signal CLE, the address latch enable signal ALE, the write enable signal /WE, the read enable signals RE and /RE, and the write-protect signal /WP) from the memory controller 1 through the NAND bus. "/" added to the signal name represents that the signal is active when low. In addition, the logic control circuit 21 transmits the ready/busy signal RB to the memory controller 1 through the NAND bus.

The register 26 includes a command register, an address register, and a status register. The command register temporarily stores a command. The address register temporarily stores an address. The status register temporarily stores data indicating status of the nonvolatile memory 2. The register 26 is configured with, for example, SRAM.

The sequencer 27 receives a command from the register 26 and controls the nonvolatile memory 2 in accordance with a sequence based on this command.

The voltage generation circuit 28 receives a power supply voltage from the outside of the nonvolatile memory 2 and generates a plurality of voltages required for a write operation, a read operation, and an erasing operation using the received power supply voltage. The voltage generation circuit 28 supplies the generated voltages to the memory cell array 23, the sense amplifier 24, the row decoder 25, and the like.

The row decoder 25 receives a row address from the register 26 and decodes the received row address. The row decoder 25 executes a selection operation of a word line based on the decoded row address. The row decoder 25 supplies a plurality of voltages required for a write operation, a read operation, and an erasing operation to the selected block.

The sense amplifier 24 receives a column address from the register 26 and decodes the received column address. The sense amplifier 24 includes a sense amplifier unit group 24A connected to the respective bit lines, and the sense amplifier unit group 24A selects any one from the bit lines based on the decoded column address. In addition, the sense amplifier unit group 24A detects and amplifies data read from the memory cell transistor to the bit line when the data is read. In addition, the sense amplifier unit group 24A transfers write data to the bit line when the data is written.

The sense amplifier 24A includes a data register 24B. When data is read, the data register 24B temporarily stores the data detected by the sense amplifier unit group 24A and serially transfers the data to the input/output circuit 22. In addition, when data is written, the data register 24B temporarily stores the data that is serially transferred from the input/output circuit 22 and transfers the data to the sense amplifier unit group 24A. The data register 24B is configured with, for example, SRAM.

Block Configuration of Memory Cell Array

Figure 3:
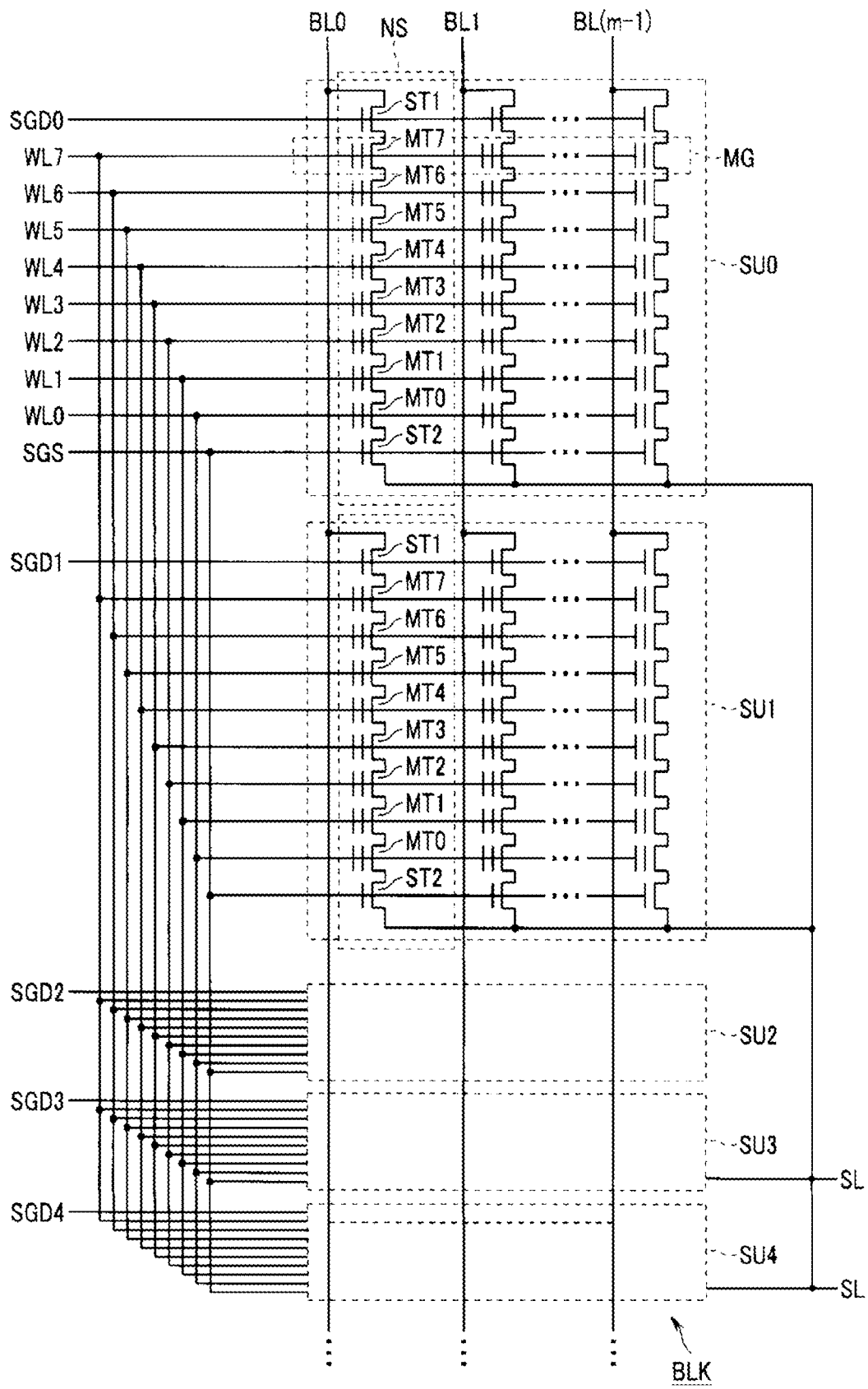
FIG. 3 is a diagram illustrating a configuration example of a block of a NAND memory cell array having a three-dimensional structure.

FIG. 3 is a diagram illustrating a configuration example of a block of a NAND memory cell array 23 having a three-dimensional structure. FIG. 3 illustrates one block BLK among a plurality of blocks that make up the memory cell array 23. Other blocks of the memory cell array have the same configuration as that of FIG. 3. In alternative embodiments, a memory cell array may have a two-dimensional structure.

As illustrated in the drawing, the block BLK includes, for example, five string units (SU0 to SU4). In addition, each of the string units SU includes a plurality of NAND strings NS. Here, each of NAND strings NS includes eight memory cell transistors MT (MT0 to MT7) and select gate transistors ST1 and ST2. Here, the number of memory cell transistors MT in the NAND string NS is 8. However, the number is not limited to 8 and may be, for example, 32, 48, 64, or 96. The select gate transistors ST1 and ST2 are illustrated as one transistor and may have the same structure as that of the memory cell transistor. In addition, for example, in order to improve cut-off characteristics, a plurality of select gate transistors may be used as the select gate transistors ST1 and ST2. Further, a dummy cell transistor may be provided between the memory cell transistors MT and the select gate transistors ST1 and ST2.

The memory cell transistors MT are arranged between the select gate transistors ST1 and ST2 such that the transistors are connected in series. A memory cell transistor MT7 on one end side is connected to the select gate transistor ST1, and a memory cell transistor MT0 on the other end side is connected to the select gate transistor ST2.

Gates of the respective select gate transistors ST1 of the string units SU0 to SU4 are connected to select gate lines SGD0 to SGD4 (hereinafter, when it is not necessary to distinguish between the select gate lines SGD0 to SGD4, the select gate lines SGD0 to SGD4 will be referred to as "select gate lines SGD"), respectively. On the other hand, gates of the select gate transistors ST2 are connected in common to the same select gate line SGS across the string units SU in the same block BLK. In addition, gates of the memory cell transistors MT0 to MT7 in the same block BLK are connected in common to word lines WL0 to WL7, respectively. That is, the word lines WL0 to WL7 and the select gate lines SGS are connected in common across the string units SU0 to SU4 in the same block BLK. On the other hand, the select gate lines SGD are independent from each other for each of the string units SU0 to SU4 even in the same block BLK.

The word lines WL0 to WL7 are connected to the gates of the memory cell transistors MT0 to MT7 that make up the NAND string NS, respectively. Gates of memory cell transistors MTi aligned along the same imaginary line in the block BLK are connected to the same word line WLi. In the following description, the NAND string NS may also be simply referred to as "string".

Each of the NAND strings NS is connected to the corresponding bit line. Accordingly, each of the memory cell transistors MT is connected to the bit line through the select gate transistor ST in the NAND string NS or another memory cell transistor MT. As described above, data of the memory cell transistors MT in the same block BLK is collectively erased. On the other hand, data is read and written in units of memory cell groups MG (or in units of pages). In this specification, a plurality of memory cell transistors MT connected to one word line WLi and belonging to one string unit SU are defined as the memory cell group MG. In the embodiment, the nonvolatile memory 2 is a TLC NAND memory capable of storing 3-bit (octal) data. Accordingly, one memory cell group MG can store three pages of data. Three bits that can be stored in each of the memory cell transistors MT correspond to the three pages.

Write Operation

When multi-value data is written into the memory cell transistor MT, a threshold voltage of the memory cell transistor MT is set to a value corresponding to the values of the data. If a program voltage VPGM and a bit line voltage Vbl are applied to the memory cell transistor MT, electrons are injected into a charge storage film of the memory cell transistor MT such that the threshold voltage increases. By increasing the program voltage VPGM, the amount of electrons injected increases such that the threshold voltage of the memory cell transistor MT can increase. However, due to differences in the memory cell transistors MT, the amount of electrons injected varies depending on the memory cell transistors MT even when the same program voltage VPGM is applied thereto. The electrons that are injected once are stored until an erasing operation is executed. Therefore, a program operation and a verification operation (the two operations referred to collectively as a loop) are executed multiple times while gradually increasing the program voltage VPGM so as not to exceed a threshold voltage range (hereinafter, referred to as "target range") that is allowable as the threshold voltage to be set for each of the memory cell transistors MT.

Figure 4:
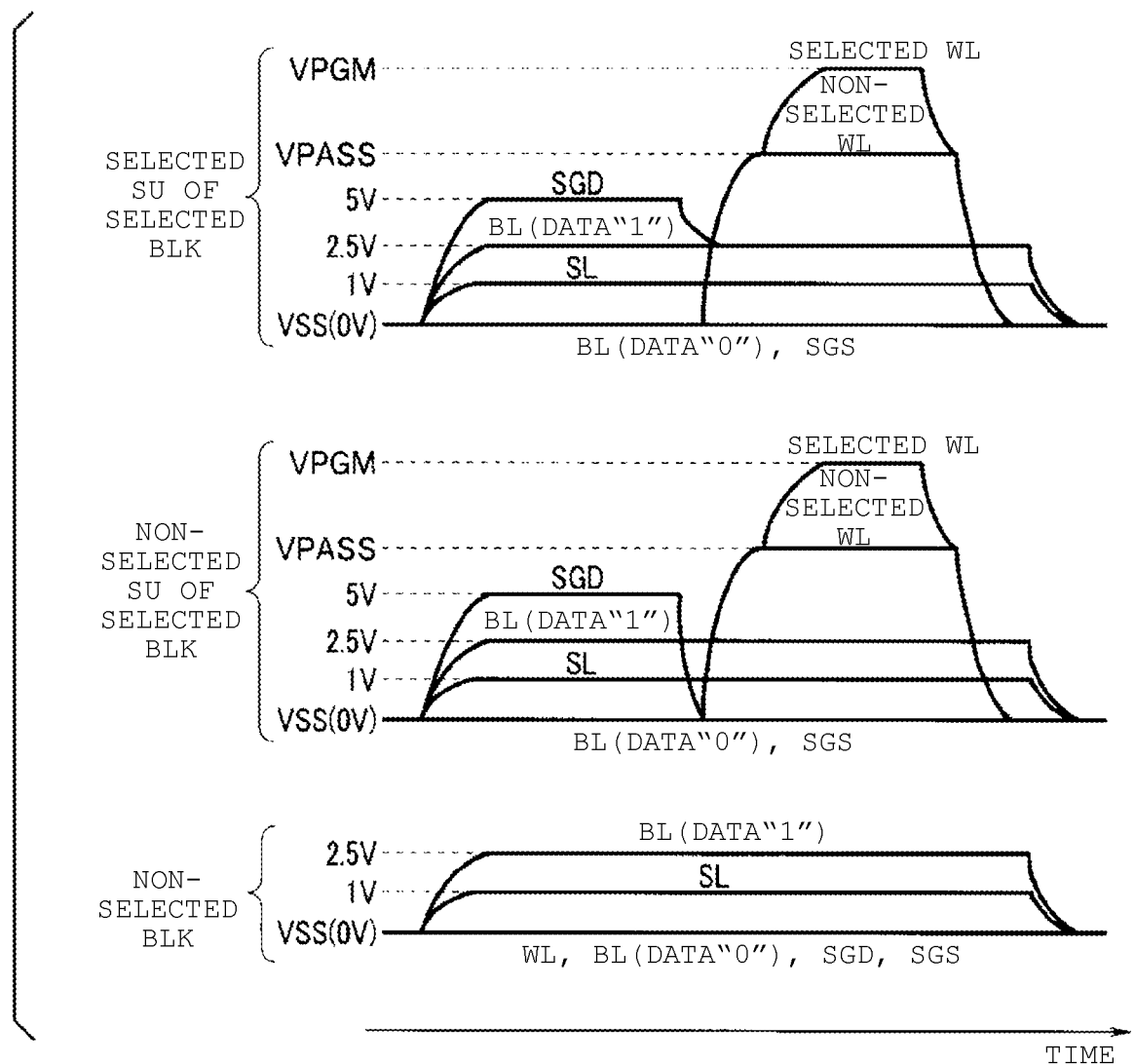
FIG. 4 is a diagram illustrating voltage levels of various wirings during a write operation.

The verification operation is a read operation that is executed as a part of a write operation. FIG. 4 is a diagram illustrating a voltage change of each of wirings during a write operation (in particular, a program operation). Each of the voltages illustrated in FIG. 4 is generated by the voltage generation circuit 28 that is controlled by the sequencer 27.

The program operation is executed in accordance with the program voltage and the bit line voltage to be applied to the word lines and the bit lines. A block BLK in which the voltages are not applied to the word lines is a non-selected BLK (the lower part in FIG. 4) that is not a target to be written. In addition, the bit line voltage is applied to the memory cell transistors MT by causing the select gate transistors ST1 connected to the bit lines BL to go into a conductive state. Therefore, in a block BLK (selected BLK) as a target to be written, a string unit SU to which the select gate lines SGD are not applied is a non-selected SU (middle part in FIG. 4) that is not a target to be written. In the non-selected SU (middle part in FIG. 4) of the selected BLK, the select gate transistors ST1 may go into a conductive state by setting the select gate lines SGD to, for example, 5 V before applying the program voltage VPGM.

In the selected string unit SU (upper part in FIG. 4), which is a target to be written in the block BLK (selected BLK), the select gate transistors ST1 may go into a conductive state by setting the select gate lines SGD to, for example, 5 V before applying the program voltage VPGM. This is illustrated on the left side in the upper part in FIG. 4. In addition, during the program operation, the select gate line SGS is set to, for example, 0 V. Accordingly, the select gate transistors ST2 are in the OFF state. On the other hand, when the program voltage VPGM illustrated on the right side in the upper part in FIG. 4 is applied, the select gate lines SGD are set to, for example, 2.5 V. As a result, whether the select gate transistors ST1 are in a conductive or nonconductive state is determined depending on the bit line voltage of the bit lines BL connected to the select gate transistors ST1.

As described above, the sense amplifier 24 transfers data to each of the bit lines BL. For example, the ground voltage Vss of, for example, 0 V is applied as a bit line voltage Vbl_L to bit lines BL to which data "0" is assigned. A write-protect voltage Vinhibit (for example, 2.5 V) is applied as a bit line voltage Vbl_H to bit lines BL to which data "1" is assigned. Accordingly, when the program voltage VPGM is applied, the select gate transistor ST1 connected to the bit lines BL to which data "0" is assigned is caused to go into a conductive state, and the select gate transistor ST1 connected to the bit lines BL to which data "1" is assigned is cut off. The memory cell transistors MT connected to the cut-off select gate transistor ST1 are write-protected.

In the memory cell transistors MT connected to the select gate transistor ST1 in the conductive state, electrons are injected into the charge storage film according to the voltage applied to the word lines WL. The memory cell transistors MT connected to the word lines WL to which a voltage VPASS is applied as a word line voltage go into a conductive state irrespective of the threshold voltage, but electrons are not injected into the charge storage film. On the other hand, in the memory cell transistors MT connected to the word lines WL to which the program voltage VPGM is applied as a word line voltage, electrons are injected into the charge storage film according to the program voltage VPGM.

That is, the row decoder 25 selects any word line WL in the selected block BLK, the program voltage VPGM is applied to a selected word line, and the voltage VPASS is applied to other word lines (non-selected word lines) WL. The program voltage VPGM is a high voltage for injecting electrons into the charge storage film through tunneling and satisfies VPGM>VPASS. Data is supplied to each of the bit lines BL by the sense amplifier 24 while controlling the voltage of the word lines WL with the row decoder 25. As a result, the write operation (program operation) is executed on each of the memory cell transistors MT of the memory cell array 23.

Read Operation

Data is read from a multi-value memory cell transistor by applying a read voltage to the selected word line WL with the row decoder 25, sensing data read from the bit lines BL with the sense amplifier 24, and determining whether the read data is "0" or "1". In order to cause the memory cell transistors connected to the non-selected word lines WL to go into a conductive state, the row decoder 25 applies a voltage VREAD to the non-selected word lines WL, the voltage VREAD being sufficiently high for turning on each of the memory cell transistors. A voltage VREADK that is slightly higher than the voltage VREAD may be applied to adjacent word lines in order to easily cause memory cell transistors connected to the adjacent word lines to go into a conductive state.

In addition, the row decoder 25 applies a voltage VSG_sel for turning on the select gate transistors ST1 connected to select gate lines SGD (hereinafter, referred to as "SGD_sel") of a string unit (selected string unit) that is a target to be read among the string units SU, and applies a voltage VSG_usel for turning off the select gate transistors ST1 connected to select gate lines SGD (hereinafter, referred to as "SGD_usel") of a string unit (non-selected string unit) that is not a target to be read.

The row decoder 25 applies the read voltage to the selected word line and applies the voltage VREAD or VREADK to the non-selected word lines. During the read operation, the sense amplifier 24 fixes the bit lines BL to a fixed voltage (for example, 0.5 V) and charges a sense node SEN (not illustrated) in the sense amplifier unit group 24A to a predetermined precharge voltage VPre that is higher than the voltage of the bit lines BL. In this state, the logic control circuit 21 connects the sense node SEN to the bit line BL. As a result, a current flows from the sense node SEN to the bit line BL, and the voltage of the sense node SEN gradually decreases.

The voltage of the sense node SEN changes depending on the state of the threshold voltage of the memory cell transistor connected to the corresponding bit line BL. That is, when the threshold voltage of the memory cell transistor is lower than the read voltage, the memory cell transistor is in the ON state, a high cell current flows through the memory cell transistor, and the rate at which the voltage of the sense node SEN decreases increases. In addition, when the threshold voltage of the memory cell transistor is higher than the read voltage, the memory cell transistor is in the OFF state, the cell current flowing through the memory cell transistor is low or negligible, and the rate at which the voltage of the sense node SEN decreases.

Using a difference between the voltage decrease rates of the sense nodes SEN, the write state of the memory cell transistor is determined, and the result is stored in a data latch circuit. For example, at a first time point at which a predetermined first period is elapsed from the start of discharge of charges of the sense node SEN, and whether the voltage of the sense node SEN is at a low level (hereinafter, "L") or a high level (hereinafter, "H") is determined. For example, when the threshold voltage of the memory cell transistor is lower than the read voltage, the memory cell transistor is in the complete ON state, and a high cell current flows through the memory cell transistor. Therefore, the voltage of the sense node SEN decreases rapidly, the voltage decrease amount is relatively high, and the sense node SEN at the first time point is at "L".

In addition, when the threshold voltage of the memory cell transistor is higher than the read voltage, the memory cell transistor is in the OFF state, the cell current flowing through the memory cell transistor is extremely low or negligible. Therefore, the voltage of the sense node SEN decreases very gradually, the voltage decrease amount is relatively low, and the sense node SEN at the first time point is at "H" as it is.

In this way, the pad group for input/output 32 monitors the state of the sense node SEN while applying the read voltage to the selected word lines with the row decoder 25. As a result, whether the threshold voltage of the memory cell transistor is higher than or lower than the read voltage is determined. Accordingly, by applying a voltage between the respective levels to the selected word lines WL as the read voltage, the level of each of the memory cell transistors can be determined, and data assigned to each of the levels can be read.

For example, by assigning data to each of eight target regions of the TLC, three bits of data can be stored in one memory cell transistor of the TLC. In each of the memory cell transistors, data is written to be in any one of eight states, Er, A, B, C, D, E, F, and G, representing the eight target regions. During reading, by applying voltages VrA to VrG, the value of data of each of the memory cell transistors can be determined.

Select Gate Line SGD

Figure 5:
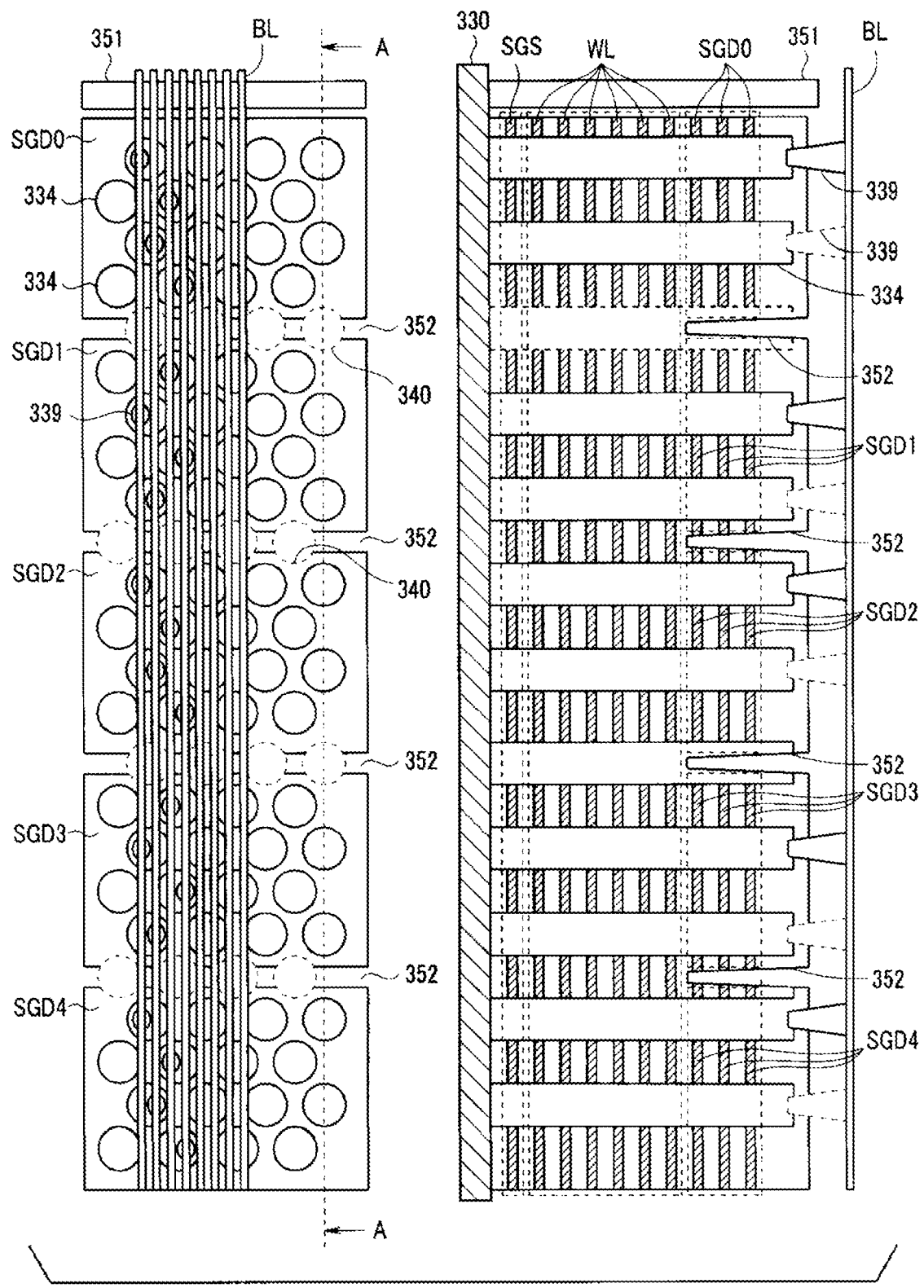
FIG. 5 is a diagram illustrating each of select gate lines in one block BLK.

FIG. 5 is a diagram illustrating each of select gate lines SGD in one block BLK. The left side of FIG. 5 illustrates a planar shape of a part of the block BLK, and the right side of FIG. 5 illustrates a cross-sectional shape taken along line A-A. Circles in FIG. 5 represent memory holes 334 configuring the NAND strings. An insulating layer 351 separates one block BLK illustrated in FIG. 5 from other blocks BLK. FIG. 5 illustrates an example in which five string units SU0 to SU4 that respectively include five select gate lines SGD0 to SGD4 separated by the insulating layer 352 are formed in one block BLK. In the example illustrated on the right side of FIG. 5, the insulating layer 352 extends up to three layers of the select gate lines SGD and separates the respective select gate lines SGD0 to SGD4 from each other.

In one string unit, a plurality of memory holes 334 for the NAND strings are provided. The number of NAND strings (number of memory holes) in one string unit is extremely large (FIG. 5 only illustrates 16 NAND strings), and the memory holes 334 are arranged in a staggered manner in order to reduce the size. The respective memory holes 334 in one string unit are connected to bit lines BL0, BL1, . . . (hereinafter, when it is not necessary to distinguish between the bit lines BL0, BL1, . . . , the bit lines BL0, BL1, . . . will be referred to as "bit lines BL") through contact plugs 339. The left side of FIG. 5 illustrates only a part of the bit lines BL and a part of the contact plugs 339 in order to not clutter the drawing.

As illustrated in FIG. 5, the respective bit lines BL0, BL1, and the like are connected to one memory hole 334 in each of the strings through the contact plugs 339. In order to connect the respective bit lines BL to one memory hole 334 in each of the strings, the positions of the contact plugs 339 are shifted in a direction perpendicular to the extending direction of the bit lines BL.

A plurality of NAND strings NS are formed on a substrate 330. That is, the select gate line SGS, the word lines WL and the select gate lines SGD are stacked on the substrate 330 through the insulating film. The memory holes 334 that penetrate the select gate line SGS, the word lines WL, and the select gate lines SGD and reach the substrate 330 are formed. On a side surface of the memory hole 334, a block insulating film (not illustrated), a charge storage film (charge storage area), and a gate insulating film are sequentially formed, and a conductor pillar (not illustrated) is further formed in the memory hole 334. The conductor pillar is formed of, for example, polysilicon and functions as an area where a channel is formed during the operation of the memory cell transistors MT and the select gate transistors ST1 and ST2 in the NAND string NS. That is, each of the select gate lines SGD, the conductor pillar, and the insulating film provided therebetween functions as the select gate transistor ST1; each of the word lines WL, the conductor pillar, and the insulating film provided therebetween functions as the memory cell transistor MT; and each of the select gate line SGS, the conductor pillar, and the insulating film provided therebetween functions as the select gate transistor ST2.

In FIG. 5, the memory hole 334 has a cylindrical shape having the same diameter. However, actually, the memory hole 334 has a tapered shape in which the diameter decreases toward the substrate 330. In addition, depending on manufacturing steps, the memory hole 334 and the conductor pillar may have a tapered shape having plural stages in which the diameter increases halfway along the tapered shape and decreases again toward the substrate 330.

In an area where the insulating layer 352 that separates the respective select gate lines SGD is formed, it is not necessary to form the memory holes 334. However, due to reasons of manufacturing, the memory holes 334 are formed in a state where the arrangement positions are made uniform. Due to this reason, the memory holes 334 are also formed in the area where the insulating layer 352 is formed. Accordingly, as illustrated in FIG. 5, in a boundary portion between each of the select gate lines SGD and an adjacent select gate line SGD, a notch portion 340 that is notched by the area where the memory holes 334 are formed is provided. On the other hand, in select gate lines SGD at both ends of each of the blocks BLK, the notch portion 340 that is notched by the area where the memory holes 334 are formed is not formed at an end of the block BLK.

In two select gate lines SGD0 and SGD4 (hereinafter, also referred to as "outer select gate lines SGD (outer)") at both ends of each of the blocks BLK, the notch portion 340 is provided only on one end side. In three remaining select gate lines SGD1 to SGD3 (hereinafter, also referred to as "inner select gate lines SGD (inner)") of each of the blocks BLK, the notch portion 340 is provided at both ends. Accordingly, the inner select gate lines SGD (inner) are narrower than the outer select gate lines SGD (outer), and thus the resistance value thereof is higher than that of the outer select gate lines SGD (outer).

In the following description, the outer select gate lines SGD (outer) of the selected string unit will be referred to as SGD_sel (outer), and the outer select gate lines SGD (outer) of the non-selected string unit will be referred to as SGD_usel (outer). In addition, the inner select gate lines SGD (inner) of the selected string unit will be referred to as SGD_sel (inner), and the inner select gate lines SGD (inner) of the non-selected string unit will be referred to as SGD_usel (inner).

Non-Selected String Discharge (USTRDIS)

Figure 6:
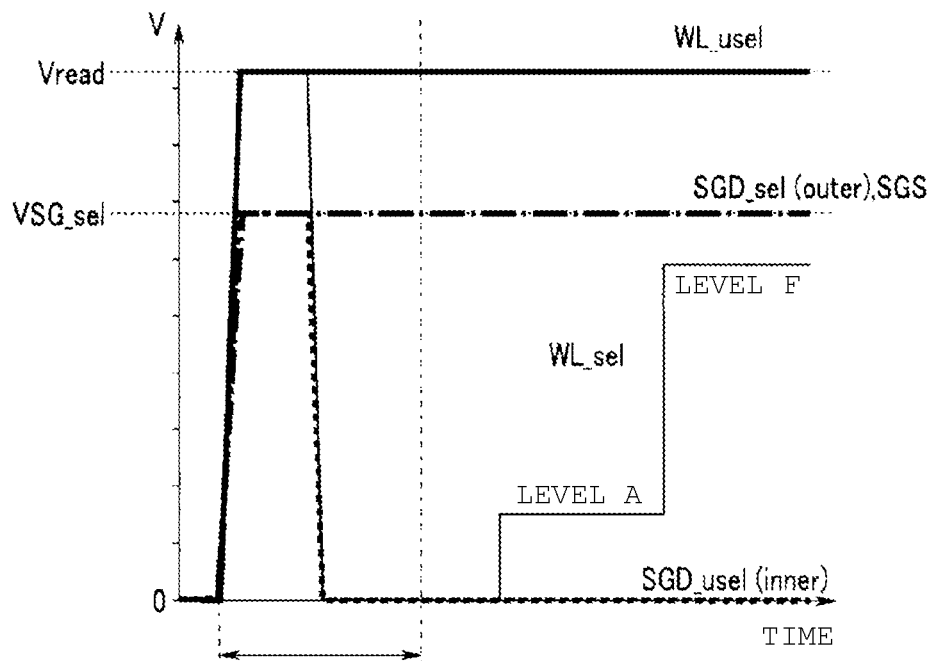
FIG. 6 is a diagram illustrating voltages of various wirings in a non-selected string discharge period involved in a read operation under an ideal condition.

FIG. 6 is a diagram illustrating non-selected string discharge (USTRDIS) period under an ideal condition, that is, if there is no resistance unbalance between the outer select gate line SGD and the inner select gate line SGD. In FIG. 6, the horizontal axis represents the time and the vertical axis represents a voltage. FIG. 6 illustrates an example in which one of the outer select gate lines SGD (outer) is selected and the remaining one of the outer select gate lines SGD (outer) and the inner select gate lines SGD (inner) are not selected. In FIG. 6, a chain line represents a voltage change of the SGD_sel (outer), and a broken line represents a voltage change of the SGD_usel (inner). An illustration of a voltage change of the SGD_usel (inner) is omitted for the sake of simplicity, as it ideally exhibits the same waveform with the voltage change of the SGD_usel (inner).

As described above, during reading, the voltage VSG_sel for turning on the select gate transistors ST1 is applied to the SGD_sel configuring the selected string unit, and the voltage VSG_usel (for example, 0 V) for turning off the select gate transistors ST1 is applied to the SGD_usel configuring the non-selected string unit. Before this read operation, non-selected string discharge (USTRDIS) is executed for both the SGD_sel and the SGD_usel.

In the USTRDIS, all the channels are caused to go into a conductive state before the operation in order to prevent disturb (erroneous writing caused by an unintentional increase in threshold voltage). That is, the read operation includes a USTRDIS period and an actual read period (hereinafter, referred to as "actual read period"). During the USTRDIS period, the SGD_sel and the SGD_usel are set to the voltage VSG_sel for turning on the select gate transistors ST1.

As illustrated in FIG. 6, the USTRDIS period is set before the actual read period. The voltage VSG_sel is applied to the SGD_sel (outer) and the SGD_usel (inner). The SGD_sel (outer) is maintained at the voltage VSG_sel during the read period. The voltage of the SGD_usel (inner) decreases up to the voltage VSG_usel (for example, 0 V) for turning off the select gate transistors ST1.

FIG. 6 illustrates an example in which non-selected word lines WL_usel are set to the voltage Vread and the voltage of selected word lines WL_sel changes to voltages for reading of the level A and the level F during the actual read period.

Figure 7:
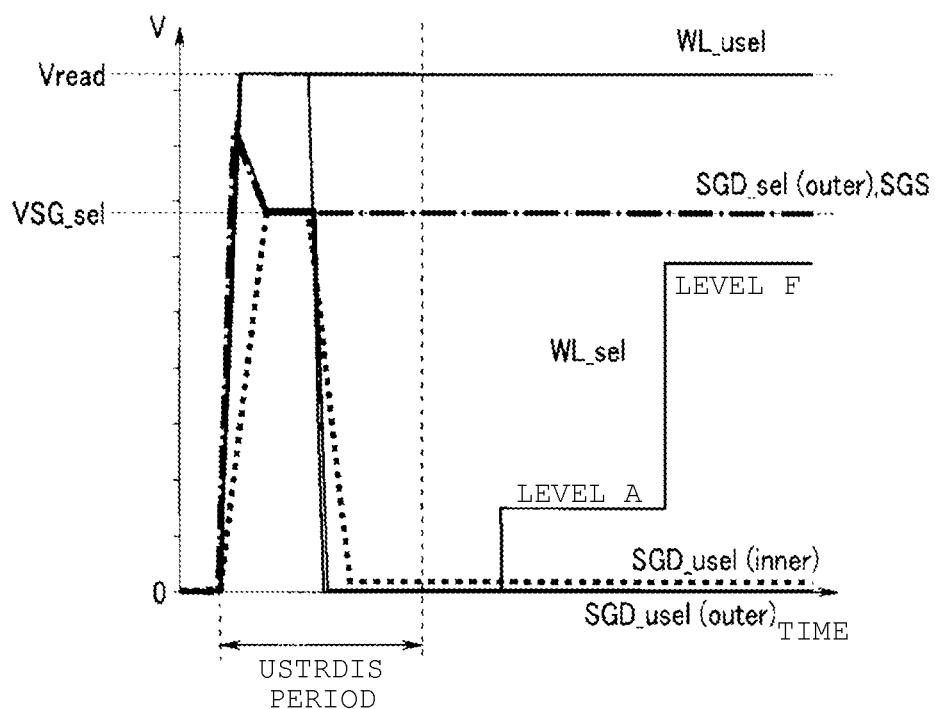
FIGS. 7 and 8 are diagrams illustrating voltages of various wirings in the non-selected string discharge period under a practical condition.
Figure 8:
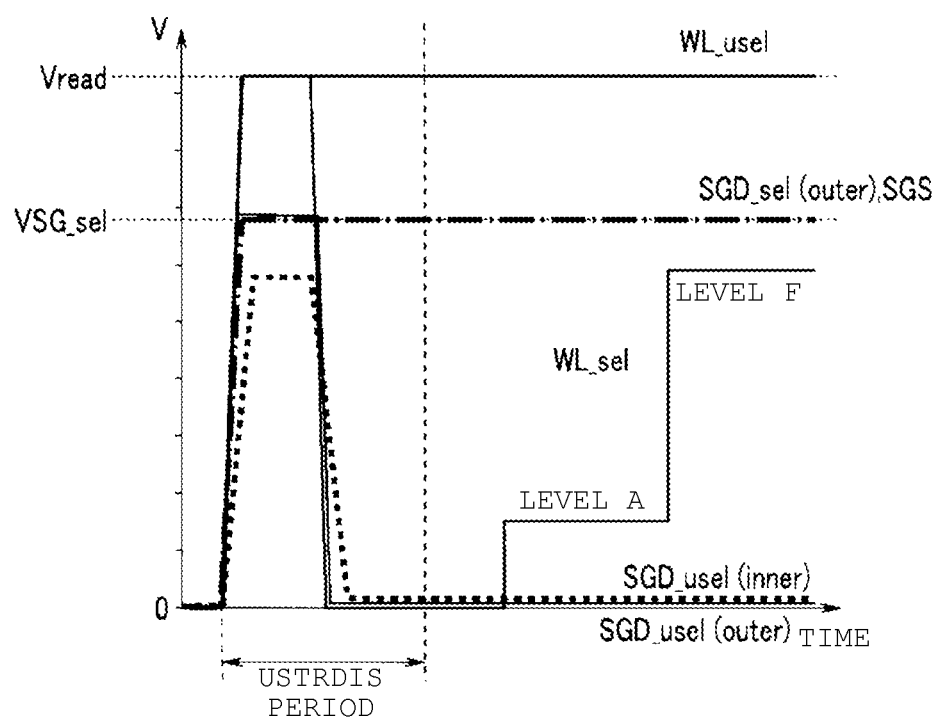

FIGS. 7 and 8 are diagrams illustrating the USTRDIS period under a practical condition, which corresponds to a case where there is a resistance unbalance between the outer select gate line SGD and the inner select gate line SGD, using the same representations as those of FIG. 6. In FIGS. 7 and 8, the voltage change of the SGD_sel (outer) is represented by a chain line, the voltage change of the SGD_usel (outer) is represented by a solid line, and the voltage change of the SGD_usel (inner) is represented by a broken line.

In the USTRDIS, a relatively long period of time is required for transition of the SGD_sel and the SGD_usel from 0 V to the target voltage VSG_sel. Therefore, in order to reduce the time, the voltage generation circuit 28 generates an overdrive voltage at a level exceeding the voltage VSG_sel as the target voltage at the transition timing.

The overdrive voltage is a voltage that is higher than the target voltage VSG_sel in the positive direction. As a result of applying the overdrive voltage, the SGD_sel and the SGD_usel reach the target voltage VSG_sel within a relatively short period of time.

However, as described above, the resistance value of the inner select gate lines SGD (inner) is higher than that of the outer select gate lines SGD (outer). Therefore, even when the overdrive voltage is applied to the inner select gate lines SGD (inner), a period of time required for the inner select gate lines SGD (inner) to reach the target voltage VSG is longer than a period of time required for the outer select gate lines SGD (outer) to reach the target voltage VSG (the inclination of FIG. 7 decreases). As a result, as illustrated in FIG. 7, when the inner select gate lines SGD (inner) is attempted to reach the target voltage, the voltages of the SGD_sel (outer) and the SGD_usel (outer) as the outer select gate lines SGD (outer) exceed the target voltage VSG_sel and are overshoot.

FIG. 8 illustrates an example in which the overdrive time is reduced or the amount of kick is reduced (the overdrive voltage is reduced) in order to prevent overshooting. In this case, overshooting does not occur in the SGD_sel (outer) and the SGD_usel (outer). However, the voltage of the SGD_usel (inner) does not reach the target voltage VSG_sel during the USTRDIS period. As a result, electrons may be insufficiently swept out. As a result, disturb may occur in either case of FIG. 7 or 8.

Overdrive Control

Thus, in the embodiment, the resistance value of the supply circuit that supplies the overdrive voltage changes depending on whether the overdrive voltage for obtaining the target voltage VGS_sel is supplied to the outer select gate lines SGD (outer) or to the inner select gate lines SGD (inner).

Figure 9:
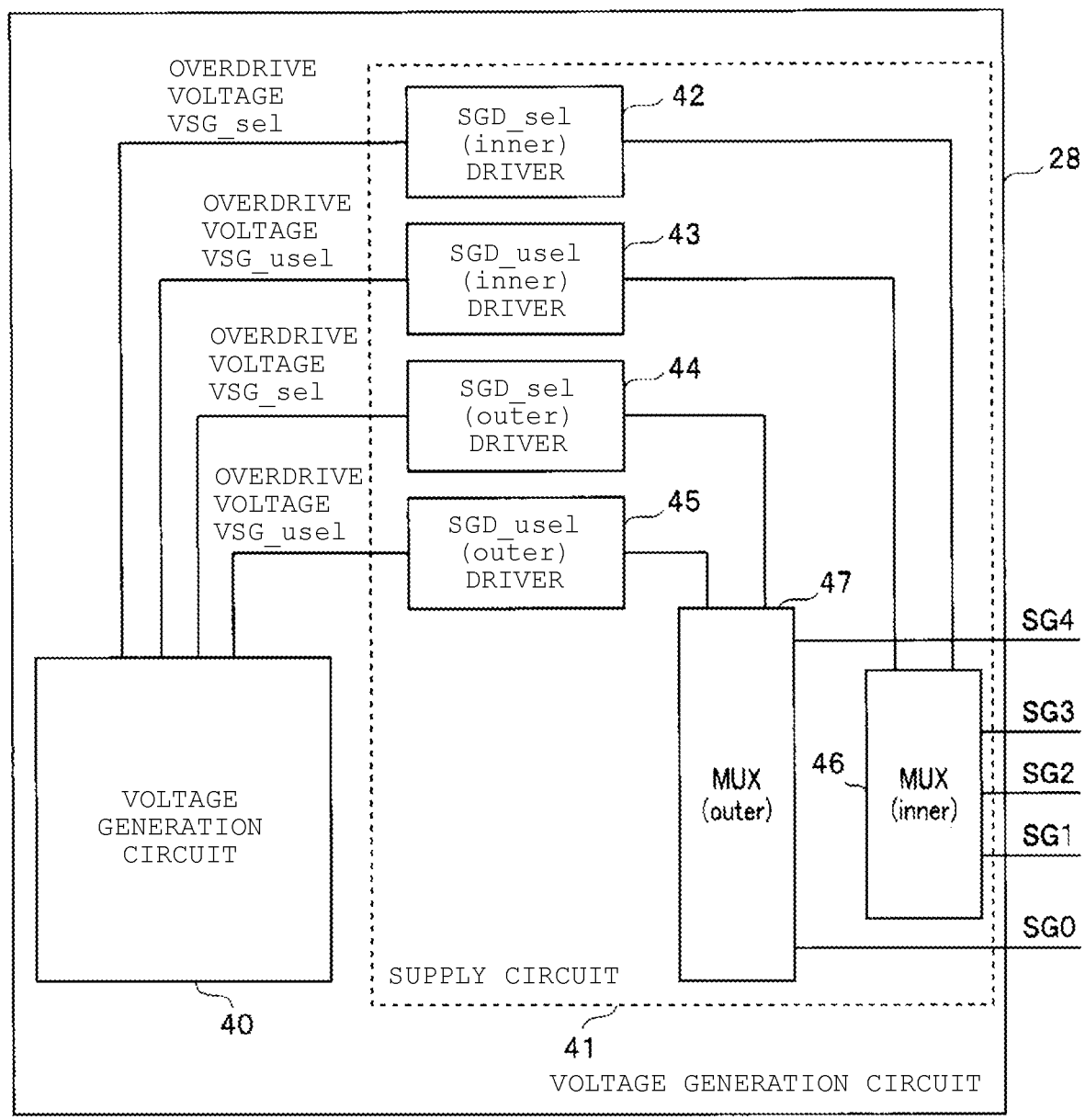
FIG. 9 is a block diagram illustrating a configuration of a part of a voltage generation circuit.

FIG. 9 is a block diagram illustrating a configuration of a part of a voltage generation circuit 28. In addition, FIG. 10 is a block diagram illustrating an example of a configuration of the row decoder 25 and the configuration of a part of the voltage generation circuit 28.

Figure 10:
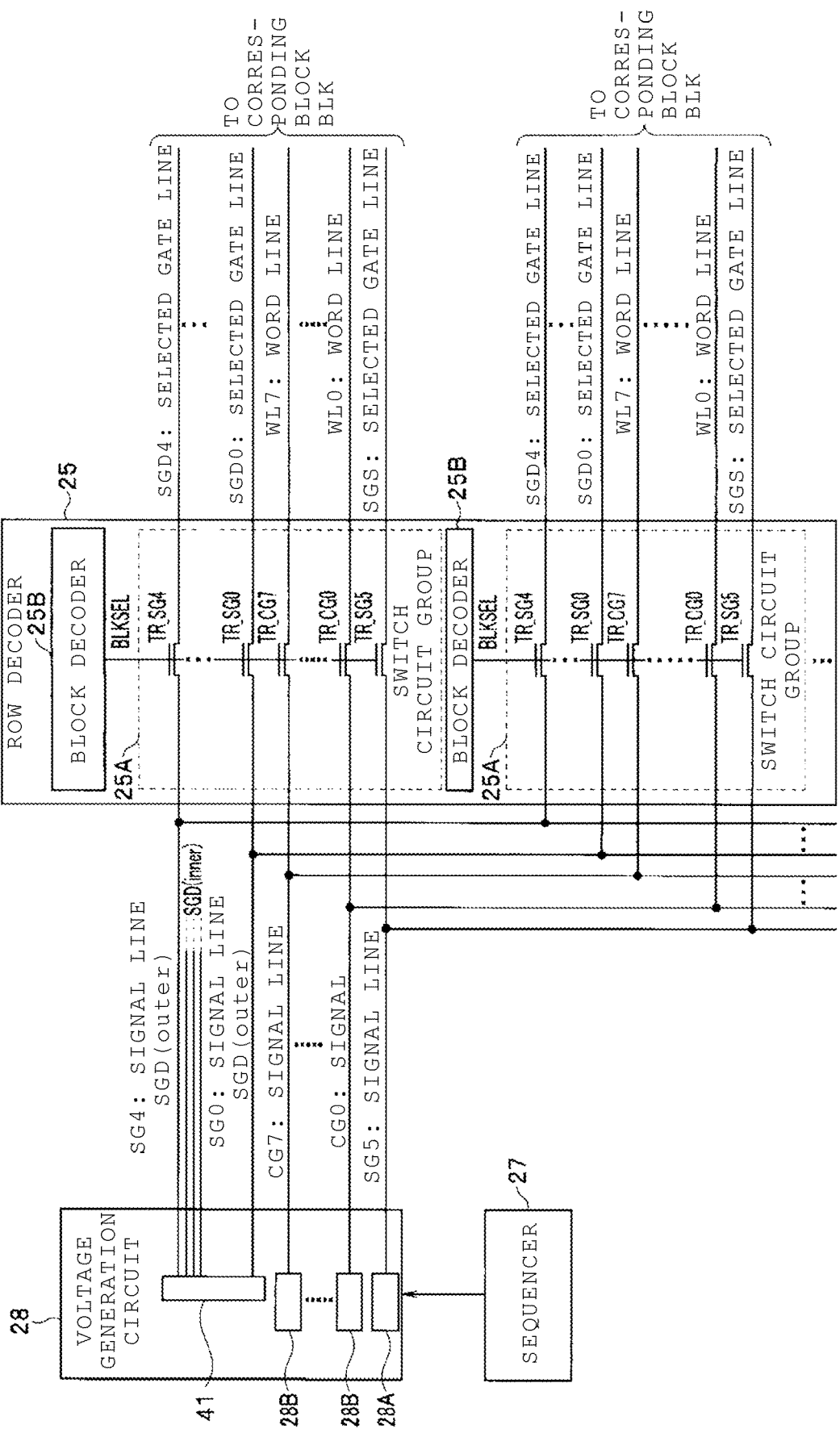
FIG. 10 is a block diagram illustrating an example of a configuration of a row decoder.

In FIG. 10, the voltage generation circuit 28 generates various voltages including voltages required for the program operation, the read operation, and the like on the memory cell transistors MT. The voltage generation circuit 28 includes: a supply circuit 41 configured to supply voltages to signal lines SG0 to SG4; a SG driver 28A configured to supply a voltage to a signal line SGS; and a plurality of CG drivers 28B configured to supply voltages to signal lines CG0 to CG7. The signal lines SG0 to SG5 and CG0 to CG7 are branched by the row decoder 25 and connected to wirings of each of the blocks BLK. That is, the signal lines SG0 to SG4 function as global drain side select gate lines and are connected to the select gate lines SGD0 to SGD4 as local select gate lines in each of the blocks BLK through the row decoder 25. The signal lines CG0 to CG7 function as global word lines and are connected to the word lines WL0 to W17 as local word lines in each of the blocks BLK through the row decoder 25. The signal line SG5 functions as a global source side select gate line and is connected to the select gate line SGS as a local select gate lines in each of the blocks BLK through the row decoder 25.

The voltage generation circuit 28 is controlled by the sequencer 27 and generates various voltages. The SG driver (the select gate line drivers) 28A and the CG driver (word line driver) 28B supply various generated voltages to the signal line SG5 and the signal lines CG0 to CG7 corresponding thereto.

The row decoder 25 includes: a plurality of switch circuit groups 25A corresponding to the respective blocks; and a plurality of block decoders 25B provided corresponding to the switch circuit groups 25A. Each of the switch circuit groups 25A includes: a plurality of transistors TR_SG0 to TR_SG4 that connect the signal lines SG0 to SG4 and the select gate lines SGD0 to SGD4, respectively; a plurality of transistors TR_CG0 to TR_CG7 that connect the signal lines CG0 to CG7 and the word lines WL0 to WL7, respectively; and a transistor TR_SG5 that connects the signal line SG5 and the select gate line SGS. Each of the transistors TR_SG0 to TR_SG5 and the transistors TR_CG0 to TR_CG7 is a high breakdown voltage transistor.

When each of the block decoders 25B itself is designated by the row address, a block selection signal BLKSEL is supplied to gates of the transistors TR_SG0 to TR_SG5 and the transistors TR_CG0 to TR_CG7. As a result, in the switch circuit group 25A to which the block selection signal BLKSEL is supplied from the block decoder 25B designated by the row address, the transistors TR_SG0 to TR_SG5 and the transistors TR_CG0 to TR_CG7 enter the ON state and go into a conductive state. Therefore, the voltages supplied from the voltage generation circuit 28 to the signal lines SG0 to SG5 and the signal lines CG0 to CG7 are supplied to the select gate lines SGD0 to SGD4 and SGS and the word lines WL0 to WL7 in the block BLK as a target to be operated.

That is, the voltage generation circuit 28 and the row decoder 25 supply a read voltage VCGRV to the selected word lines WL and supply the voltage VREAD or VREADK to the non-selected word lines WL. In addition, for example, the voltage VSG_sel is supplied to the select gate lines SGD (SGD_sel) connected to the select gate transistors ST1 belonging to the string unit SU as a target to be operated, and the voltage VSG_usel such as 0 V is supplied to the select gate lines SGD (SGD_usel) connected to the select gate transistors ST1 not belonging to the string unit SU as a target to be operated.

In FIG. 9, the voltage generation circuit 28 includes a voltage generation circuit 40 and a supply circuit 41. FIG. 9 illustrates only a circuit for supplying voltages to the select gate lines SGD. The voltage generation circuit 40 is configured with a charge pump circuit or the like and generates various voltages. The supply circuit 41 includes a SGD_sel (inner) driver 42, a SGD_usel (inner) driver 43 a SGD_sel (outer) driver 44, a SGD_usel (outer) driver 45, an inner multiplexer circuit (MUX (inner)) 46, and an outer multiplexer circuit (MUX (outer)) 47.

Figure 11:
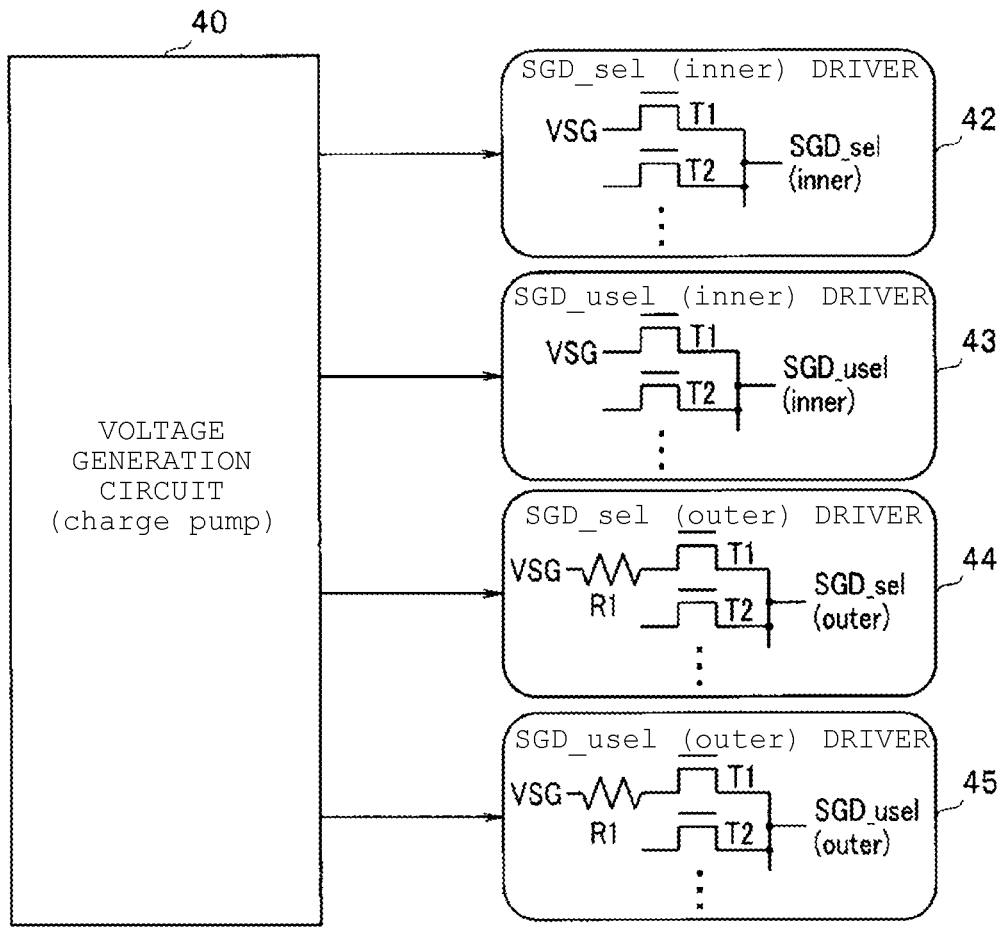
FIG. 11 is a circuit diagram illustrating an example of specific configurations of drivers in FIG. 9.

FIG. 11 is a circuit diagram illustrating an example of specific configurations of the drivers 42 to 45 in FIG. 9.

Each of the drivers 42 to 44 includes a plurality of input terminals to which plural kinds of input voltages are input, and the plural kinds of voltages can be input from the voltage generation circuit 40 through the input terminals. The respective input terminals of the drivers 42 to 44 are connected to one output terminal through switches T1, T2, . . . arranged on respective supply paths of the plural kinds of voltages. By selecting one switch from the switches T1, T2, . . . and turning on the selected switch, a voltage applied to the supply path connected to the selected switch appears at the output terminal.

The drivers 42 and 43 correspond to the SGD Inner. The driver 42 outputs the voltage VSG_sel applied to the selected select gate lines SGD_sel from the output terminal, and the driver 43 outputs the voltage VSG_usel applied to the non-selected select gate lines SGD_usel from the output terminal.

The drivers 44 and 45 correspond to the outer select gate lines SGD (outer). The driver 44 outputs the voltage VSG_sel applied to the selected select gate lines SGD_sel from the output terminal, and the driver 45 outputs the voltage VSG_usel applied to the non-selected select gate lines SGD_usel from the output terminal.

In the embodiment, in the drivers 44 and 45 corresponding to the outer select gate lines SGD (outer) among the drivers 42 to 44, a resistor R1 is provided on a voltage supply path. A ramp rate (voltage increase rate) of the voltage applied to the outer select gate lines SGD (outer) is reduced by the resistor R1. As the resistor R1, a metal wiring is adopted. By thinly forming the metal wiring, the effective resistance value may be increased.

The overdrive voltage for obtaining the target voltage VSG_sel is applied from the voltage generation circuit 40 to the drivers 42 and 44 during the USTRDIS period, and the voltage VSG_sel at the time of selection of the select gate lines SGD is applied to the drivers 42 and 44 during the actual read period. In addition, the target voltage VSG_sel is applied to the drivers 43 and 45 during the USTRDIS period, and the voltage VSG_usel at the time of non-selection of the select gate lines SGD is applied to the drivers 43 and 45 during the actual read period. The overdrive voltage output from the voltage generation circuit 40 during the USTRDIS period is higher than the voltage VSG_sel.

Figure 12:
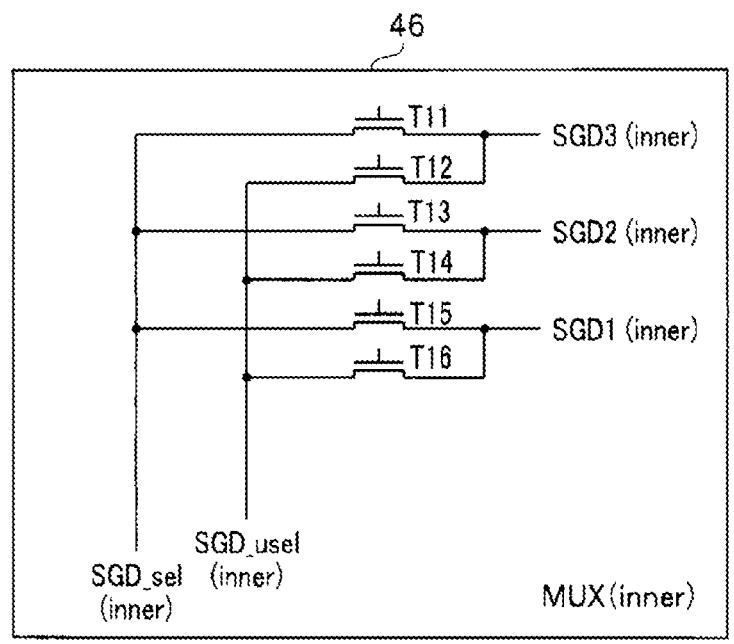
FIG. 12 is a circuit diagram illustrating an example of a specific configuration of an inner multiplexer circuit in FIG. 9.
Figure 13:
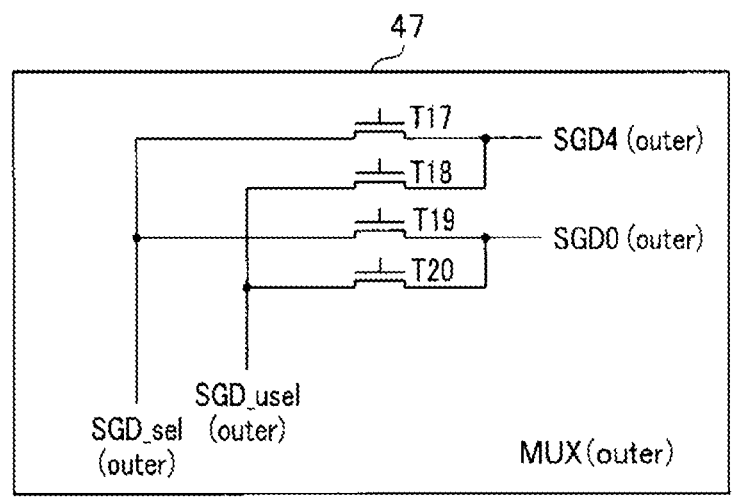
FIG. 13 is a circuit diagram illustrating an example of a specific configuration of an outer multiplexer in FIG. 9.

FIGS. 12 and 13 are circuit diagrams illustrating an example of specific configurations of the MUX (inner) 46 and the MUX (outer) 47 in FIG. 9.

In FIG. 12, the MUX (inner) 46 includes six switches T11 to T16 on the voltage supply path. The voltage VSG_sel is applied from the SGD_sel (inner) driver 42 to the input terminals of the switches T11, T13, and T15, and the voltage VSG_usel is applied from the SGD_usel (inner) driver 43 to the input terminals of the switches T12, T14, and T16. The output terminals of the switches T15 and T16 are connected in common to a select gate line SGD1 (inner). In addition, the output terminals of the switches T13 and T14 are connected in common to a select gate line SGD2 (inner), and the output terminals of the switches T11 and T12 are connected in common to a select gate line SGD3 (inner).

By selecting one switch from the switches T15 and T16 and turning on the selected switch, the voltage supplied to the selected switch is supplied to the SDG1 (inner). Likewise, by selecting one switch from the switches T13 and T14 and turning on the selected switch, the voltage supplied to the selected switch is supplied to the SDG2 (inner). By selecting one switch from the switches T11 and T12 and turning on the selected switch, the voltage supplied to the selected switch is supplied to the SDG1 (inner).

In FIG. 13, the MUX (outer) 47 includes four switches T17 to T20 on the voltage supply path. The voltage VSG_sel is applied from the SGD_sel (outer) driver 44 to the input terminals of the switches T17 and T19, and the voltage VSG_usel is applied from the SGD_usel (outer) driver 45 to the input terminals of the switches T18 and T19. The output terminals of the switches T19 and T20 are connected in common to a select gate line SGD0 (outer). In addition, the output terminals of the switches T17 and T18 are connected in common to a select gate line SGD4 (outer).

By selecting one switch from the switches T19 and T20 and turning on the selected switch, the voltage supplied to the selected switch is supplied to the SDG0 (outer). Likewise, by selecting one switch from the switches T17 and T18 and turning on the selected switch, the voltage supplied to the selected switch is supplied to the SDG4 (outer).

Figure 14:
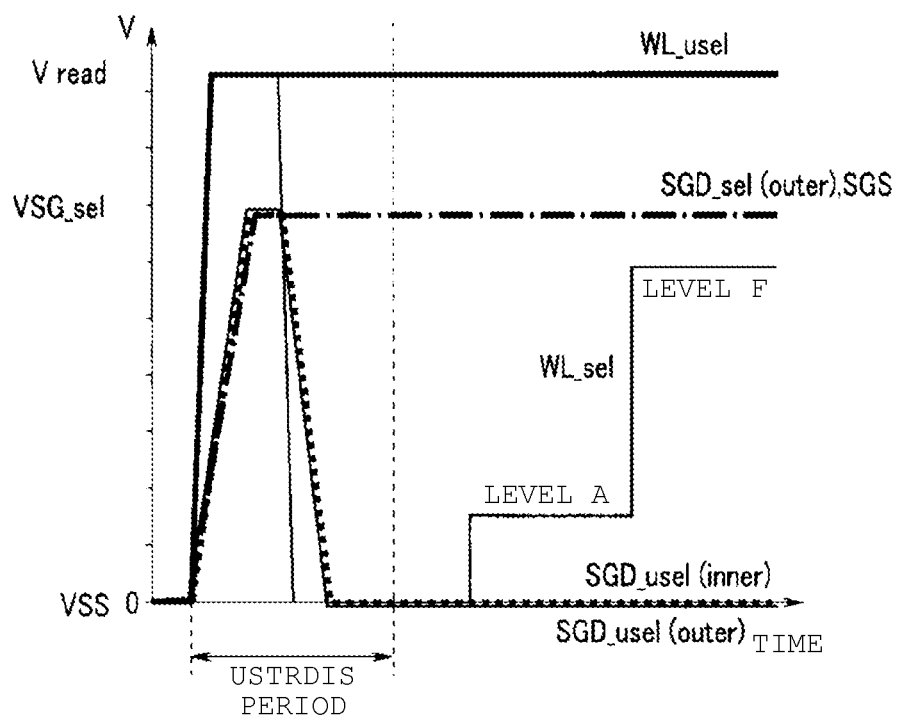
FIG. 14 is a diagram illustrating voltages of various wiring that are generated during a period of a read operation that includes a non-selected string discharge period, according to the embodiment.

Next, the operation of the embodiment having the above-described configuration will be described with reference to FIG. 14. FIG. 14 is a diagrams illustrating the effect of the embodiment during the USTRDIS period using the same representations as those of FIG. 6. In FIG. 14, the voltage change of the SGD_sel (outer) is represented by a chain line, the voltage change of the SGD_usel (outer) is represented by a solid line, and the voltage change of the SGD_usel (inner) is represented by a broken line.

Here, it is assumed that data is read from a memory cell transistor into which the data is written using predetermined coding. Information regarding various voltages required for reading data is stored in a memory (not illustrated) of the sequencer 27. The sequencer 27 causes the voltage generation circuit 28 to generate voltages required for reading based on the information.

That is, the voltage generation circuit 28 is controlled by the sequencer 27 to generate the overdrive voltages during the USTRDIS period and applies the overdrive voltages to the drivers 42 to 45. The drivers 42 to 45 turn on the switch T1 and select and output the overdrive voltage. The resistance value of the select gate lines SGD1 to SGD3 to which the overdrive voltage is supplied by the drivers 42 and 43 is higher than the resistance value of the select gate lines SGD0 and SGD4 to which the overdrive voltage is supplied by the drivers 44 and 45. However, in the driver 44 and 45, the resistor R1 is provided on the voltage supply path. Therefore, the voltage increase rate of the select gate lines SGD0 and SGD4 is reduced. In this way, the voltage change of the inner select gate lines SGD (inner) and the voltage change of the outer select gate lines SGD (outer) can be made to be substantially the same, and the voltage increase rates of the select gate lines SGD0 to SGD4 can be made to be uniform.

As illustrated in FIG. 14, the voltages of the SGD (inner) and the SGD (outer) change at substantially the same voltage increase rate during the USTRDIS period. As a result, overshooting does not occur in the SGD (outer), and the voltages of the SGD (outer) and the SGD (inner) reach the target voltage VSG_sel through the same voltage change within a shorter period of time.

In the embodiment, by changing a resistance value of an overdrive voltage supply circuit depending on the types of select gate lines, voltages that are applied to select gate lines can be made uniform irrespective of the types of the select gate lines, and a target voltage can be reached within a short period of time.

Second Embodiment

Figure 15:
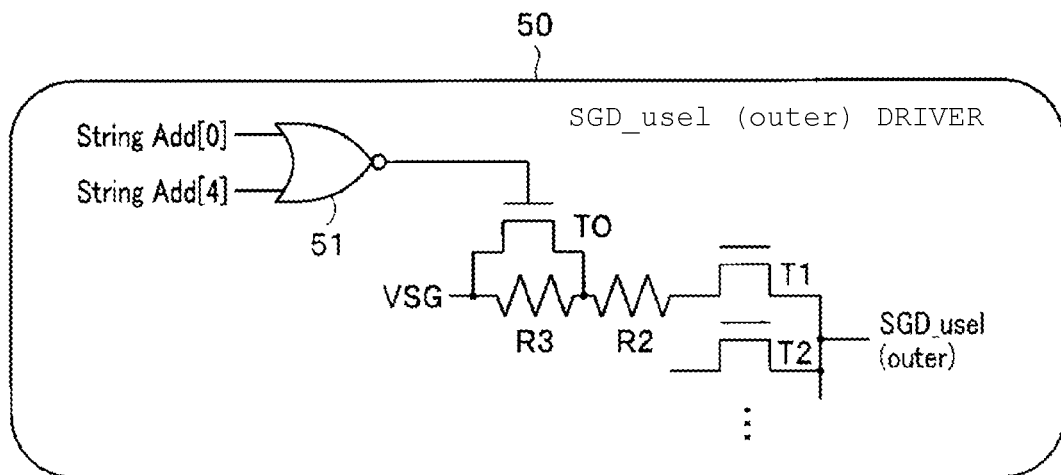
FIG. 15 is a circuit diagram illustrating an outer driver of a second embodiment.

FIG. 15 is a circuit diagram illustrating a SGD_usel (outer) driver adopted in a second embodiment. The SGD_usel (outer) driver illustrated in FIG. 15 is adopted instead of the SGD_usel (outer) driver 45 illustrated in FIG. 11, and other hardware configurations of the second embodiment are the same as those of the first embodiment.

When an outer select gate line SGD (outer) in one block BLK is selected, other outer select gate lines SGD (outer) in the block BLK are not selected. When an inner select gate line SGD (inner) in one block BLK is selected, both the two outer select gate lines SGD (outer) in the block BLK are not selected. Accordingly, depending on the selection states, the voltage VSG_usel for non-selection is supplied from the voltage generation circuit 40 to one outer select gate line SGD (outer) or to the two outer select gate lines SGD (outer).

That is, the output of the SGD_usel (outer) driver 45 of FIG. 11 is supplied to one outer select gate line SGD (outer) through only one of the switches T18 and T20 of the MUX (outer) 47 or is supplied to the two outer select gate lines SGD (outer) through the two switches T18 and T20 of the MUX (outer) 47. That is, depending on the selection states, the load of the SGD_usel (outer) driver 45 changes, and the voltage increase rates of the outer select gate lines SGD (outer) cannot be made to be uniform. Therefore, in the embodiment, a SGD_usel (outer) driver 50 is adopted instead of the SGD_usel (outer) driver 45.

In the SGD_usel (outer) driver 50, a NOR circuit 51 and a switch TO are added to the SGD_usel (outer) driver 45 of FIG. 11, and resistors R2 and R3 are adopted instead of the resistor R1. A signal String Add [0] representing whether or not the voltage VSG_usel is applied to the select gate line SGD0 and a signal String Add [4] representing whether or not the voltage VSG_usel is applied to the select gate line SGD5 are input to the NOR circuit 51. The NOR circuit 51 executes NOR operation of the two inputs and outputs the operation result to the switch TO.

A serial circuit of the resistors R3 and R2 is provided on the voltage supply path between the output terminal of the voltage generation circuit 40 and a switch T1. The switch TO is connected to both ends of the resistor R3, and when the operation result of the NOR circuit 51 is a logic "1", the switch TO is turned on and short-circuits the resistor R3. When the operation result of the NOR circuit 51 is a logic "0", the switch circuit TO is turned off.

Figure 16:
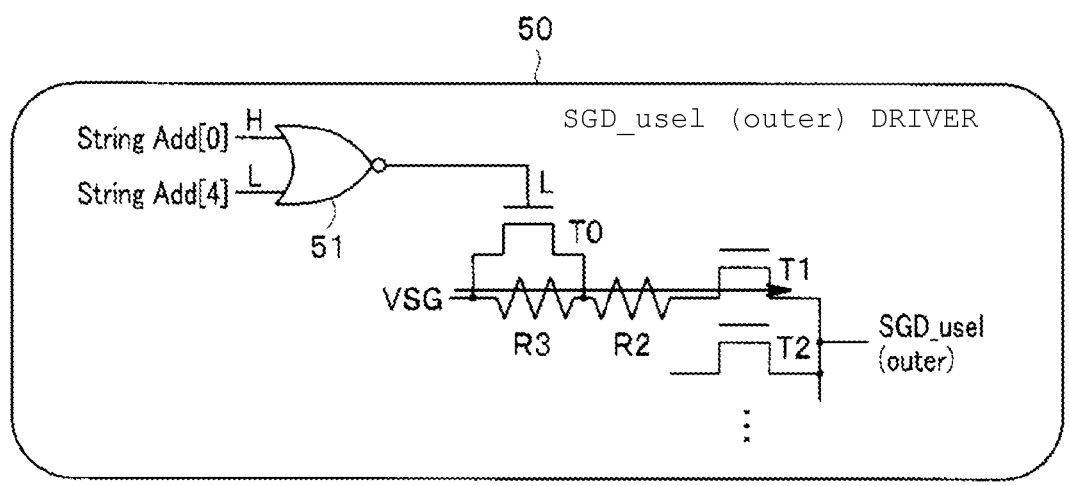
FIGS. 16 and 17 are diagrams illustrating different operating states of the outer driver of FIG. 15.
Figure 17:
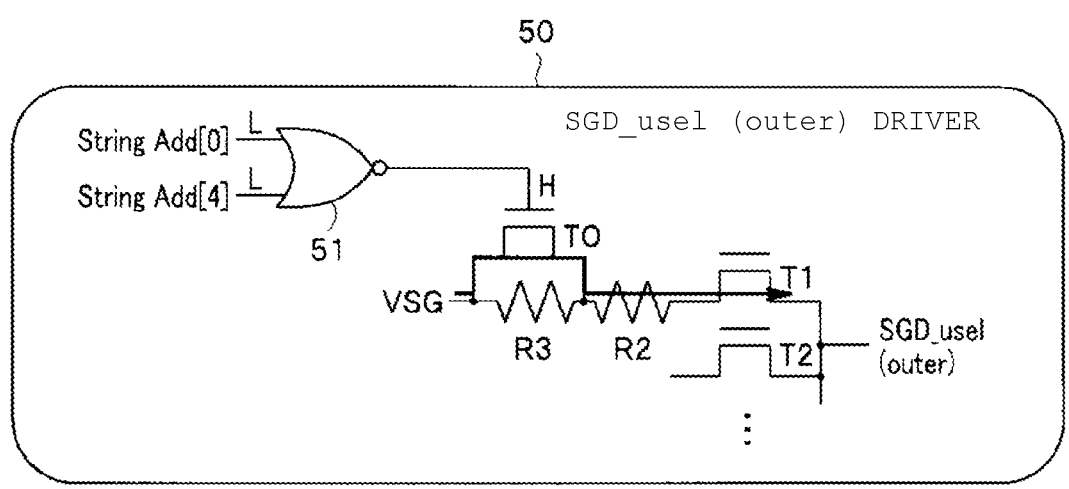

Next, the operation of the embodiment having the above-described configuration will be described with reference to FIGS. 16 and 17. FIGS. 16 and 17 are diagrams illustrating the operation of the embodiment.

Here, it is assumed that the select gate line SGD0 is selected and the select gate line SGD4 is not selected. That is, in this case, the SGD_usel (outer) driver 50 only has to supply the voltage VSG_usel to only one the outer select gate line SGD (outer). As illustrated in FIG. 16, in this case, the signal String Add [0] is at "H", and the signal String Add [4] is at "L". The output of the NOR circuit 51 is "L" (the logical value "0"), the switch circuit TO is turned off, and the resistor R3 is not short-circuited. That is, as indicated by an arrow of FIG. 16, the serial circuit of the resistors R3 and R2 is connected to the voltage supply path between the output terminal of the voltage generation circuit 40 and the switch T1. The voltage change rates of the outer select gate lines SGD (outer) are reduced by the two resistors R3 and R2.

In addition, it is assumed that both the select gate line SGD0 and the select gate line SGD4 are not selected. That is, in this case, the SGD_usel (outer) driver 50 supplies the voltage VSG_usel to the two outer select gate lines SGD (outer). As illustrated in FIG. 17, in this case, both the signal String Add [0] and the signal String Add [4] are at "L". The output of the NOR circuit 51 is "H" (the logical value "1"), the switch circuit TO is turned on, and the resistor R3 is short-circuited. That is, as indicated by an arrow of FIG. 17, only the resistor R2 is connected to the voltage supply path between the output terminal of the voltage generation circuit 40 and the switch T1. As a result, the voltage change rates of the outer select gate lines SGD (outer) are likely to increase.

In the embodiment, the SGD_usel (outer) driver changes the resistance value of the SGD_usel (outer) driver depending on whether the voltage VSG_usel is supplied to one outer select gate line SGD (outer) or to the two outer select gate lines SGD (outer). Irrespective of the select gate line SGD, the voltage change rate of the non-selected outer select gate line SGD (outer) can be made to be uniform.

The resistance values of the resistors R2 and R3 may be configured to change.

MODIFICATION EXAMPLES

Figure 18:
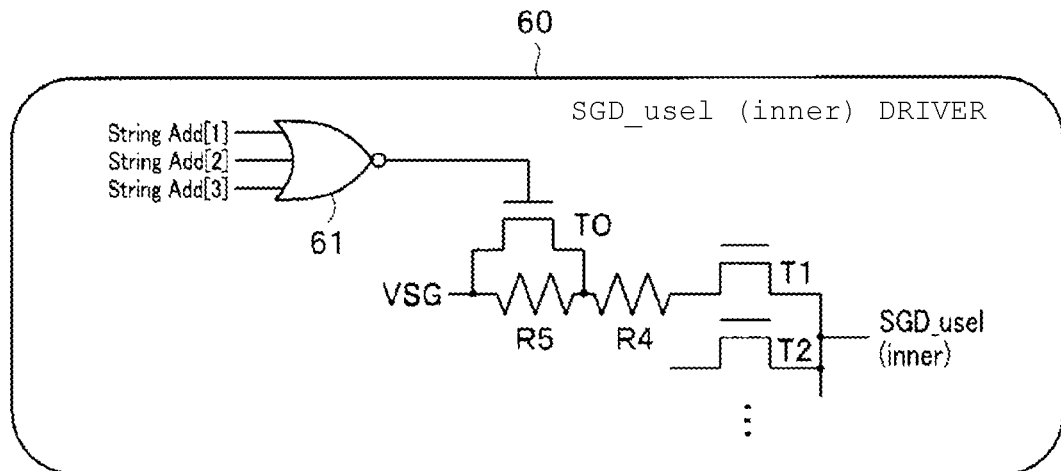
FIG. 18 is a circuit diagram illustrating an inner driver of the second embodiment.

FIG. 18 is a circuit diagram illustrating a SGD_usel (inner) driver. The SGD_usel (inner) driver illustrated in FIG. 18 is adopted instead of the SGD_usel (inner) driver 43 illustrated in FIG. 11, and other hardware configurations of the second embodiment are the same as those of the first embodiment or the second embodiment.

When an outer select gate line SGD (outer) in one block BLK is selected, all the three inner select gate lines SGD (inner) in the block BLK are not selected. On the other hand, when the inner select gate line SGD (inner) in one block BLK is selected, two inner select gate lines SGD (inner) in the block BLK are not selected. Accordingly, depending on the selection states, the voltage VSG_usel for non-selection is supplied from the voltage generation circuit 40 to two inner select gate lines SGD (inner) or to the three inner select gate lines SGD (inner).

That is, the output of the SGD_usel (inner) driver 43 in FIG. 11 is supplied to two inner select gate lines SGD (inner) through two of the switches T12, T14, and T16 of the MUX (inner) 46 or to the three inner select gate lines SGD (inner) through all the switches T12, T14, and T16 of the MUX (inner) 46. That is, depending on the selection states, the load of the SGD_usel (inner) driver 43 changes, and the voltage increase rates of the inner select gate lines SGD (inner) cannot be made to be uniform. Therefore, in the embodiment, the SGD_usel (inner) driver 60 is adopted instead of the SGD_usel (inner) driver 43.

In the SGD_usel (inner) driver 60, a NOR circuit 61, the switch TO, and resistors R4 and R5 are added to the SGD_usel (inner) driver 43 of FIG. 11. A signal String Add [1] representing whether or not the voltage VSG_usel is applied to the select gate line SGD1, a signal String Add [2] representing whether or not the voltage VSG_usel is applied to the select gate line SGD2, and a signal String Add [3] representing whether or not the voltage VSG_usel is applied to the select gate line SGD3 are input to the NOR circuit 61. The NOR circuit 61 executes NOR operation of the three inputs and outputs the operation result to the switch TO.

A serial circuit of the resistors R5 and R4 is provided on the voltage supply path between the output terminal of the voltage generation circuit 40 and a switch T1. The switch TO is connected to both ends of the resistor R5, and when the operation result of the NOR circuit 61 is a logic "1", the switch TO is turned on and short-circuits the resistor R5. When the operation result of the NOR circuit 61 is a logic "0", the switch circuit TO is turned off. A resistance ratio between the resistors R5 and R4 is set to, for example, 1:2. Regarding the resistance ratio between the resistors R5 and R4, it is preferable to consider all the resistance values from the rear stage of the driver to the inner select gate lines SGD (inner). However, the resistance values of the resistors R5 and R4 are predominant, and only the resistance values of the resistors R5 and R4 may be considered. In addition, the resistance values of the resistors R5 and R4 may be configured to change.

As the driver for outer select gate lines SGD (outer), the SGD_usel (outer) driver 50 of FIG. 15 may be adopted.

Next, the operation of the embodiment having the above-described configuration will be described.

Here, it is assumed that one of the inner select gate lines SGD (inner) is selected and other two inner select gate lines SGD (inner) are not selected. That is, in this case, the SGD_usel (inner) driver 60 only has to supply the voltage VSG_usel to the two inner select gate lines SGD (inner). In this case, one of the signals String Add [1] to String Add [3] is at "H", and the output of the NOR circuit 61 is "L" (the logical value "0"). The switch circuit TO is turned off, and the resistor R5 is not shot-circuited. That is, the serial circuit of the resistors R5 and R4 is connected to the voltage supply path between the output terminal of the voltage generation circuit 40 and the switch T1. The voltage change rates of the inner select gate lines SGD (inner) are reduced by the two resistors R5 and R4.

In addition, it is assumed that all the select gate lines SGD0 to SGD3 are not selected. That is, in this case, the SGD_usel (inner) driver 60 supplies the voltage VSG_usel to the three inner select gate lines SGD (inner). In this case, all the signals String Add [1] to String Add [3] are at "L", and the output of the NOR circuit 61 is "H" (the logical value "1"). As a result, the switch circuit TO is turned on, and the resistor R5 is short-circuited. That is, only the resistor R4 is connected to the voltage supply path between the output terminal of the voltage generation circuit 40 and the switch T1. As a result, the voltage change rates of the inner select gate lines SGD (inner) are likely to increase.

In the embodiment, the SGD_usel (inner) driver changes the resistance value of the SGD_usel (inner) driver depending on whether the voltage VSG_usel is supplied to two inner select gate lines SGD (inner) or to the three inner select gate lines SGD (inner). Irrespective of the select gate line SGD, the voltage change rates of the non-selected inner select gate lines SGD (inner) can be made to be uniform.

Third Embodiment

Figure 19:
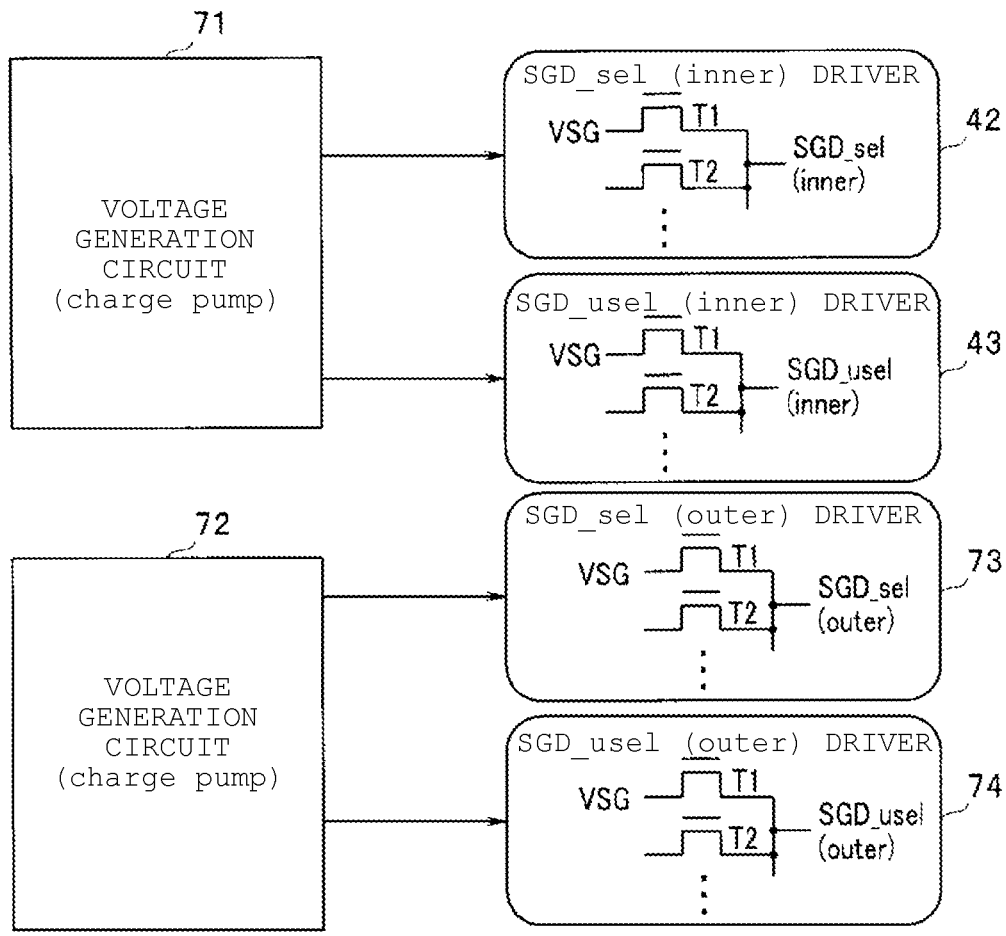
FIG. 19 is a block diagram illustrating a third embodiment.

FIG. 19 is a block diagram illustrating a third embodiment. This embodiment is different from the first embodiment in that voltage generation circuits 71 and 72 are adopted instead of the voltage generation circuit 40 of FIG. 11 and drivers 73 and 74 are adopted instead of the drivers 44 and 45, and other configurations are the same as those of the first embodiment.

In the embodiment, during the USTRDIS period, an application period (overdrive period) of the overdrive voltage to the outer select gate lines SGD (outer) is different from an application period (overdrive period) of the overdrive voltage to the inner select gate lines SGD (inner). As a result, while preventing the occurrence of overshooting, the voltage applied to the select gate lines can be made to reach the target voltage within a short period of time irrespective of the types of the select gate lines.

A SGD_sel (outer) driver 73 has the same configuration as the SGD_sel (inner) driver 42, and a SGD_usel (outer) driver 74 has the same configuration as the SGD_usel (inner) driver 43. Each of the voltage generation circuits 71 and 72 has the same configuration as the voltage generation circuit 40.

Figure 20:
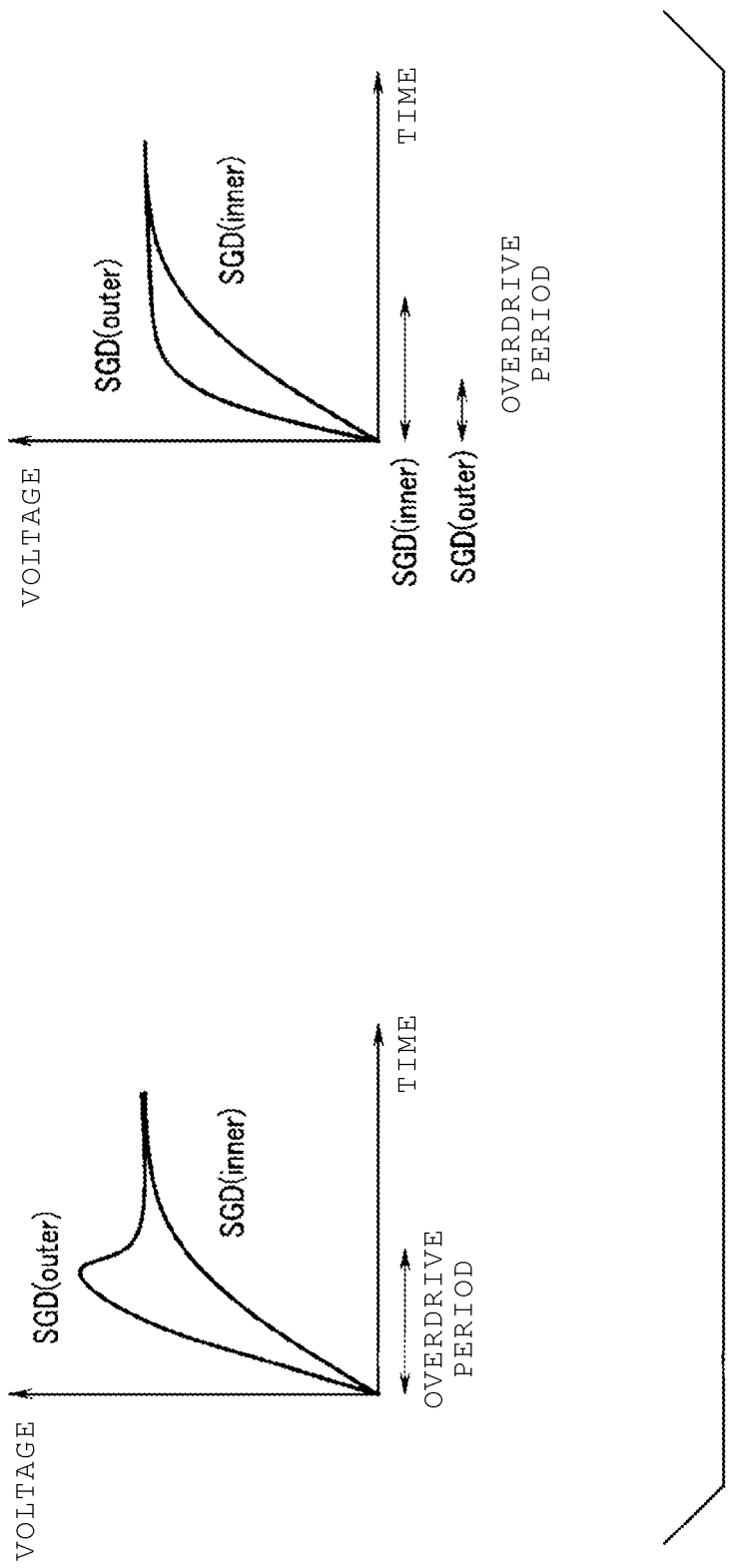
FIG. 20 is a diagram illustrating voltages of various wirings that are generated during a period of a read operation that includes a non-selected string discharge period, according to a comparative example and according to the third embodiment.

Next, the operation of the embodiment having the above-described configuration will be described with reference to FIG. 20. FIG. 20 is a diagram illustrating voltage changes of the outer select gate lines SGD (outer) and the inner select gate lines SGD (inner) during the USTRDIS period, in which the horizontal axis represents the time and the vertical axis represents a voltage. The left side of FIG. 20 illustrates characteristics in Comparative Example, and the right side of FIG. 20 illustrates characteristics of the embodiment.

In Comparative Example of FIG. 20, during the USTRDIS period, the same overdrive voltage is applied to the outer select gate lines SGD (outer) and the inner select gate lines SGD (inner). As described above, in this case, the resistance value of the inner select gate lines SGD (inner) is higher than the resistance value of the outer select gate lines SGD (outer). Therefore, in order to make the inner select gate lines SGD (inner) to reach the target voltage, overshooting occurs in the outer select gate lines SGD (outer).

On the other hand, in the embodiment, the voltage generation circuits 71 and 72 generate the overdrive voltage having the same voltage level, but the overdrive periods thereof are different from each other. That is, the voltage generation circuit 71 generates the overdrive voltage during a relatively long period, and the voltage generation circuit 72 generates the overdrive voltage during a shorter period than that of the voltage generation circuit 71.

The output of the voltage generation circuit 71 is supplied to the SGD_sel (inner) drivers 42 and 43, and the output of the voltage generation circuit 72 is supplied to the SGD_sel (outer) drivers 73 and 74. The SGD_sel (inner) driver 42 and the driver 73 have the same configuration, the output of the SGD_sel (inner) driver 42 and the output of the SGD_sel (outer) driver 73 are different only in the overdrive period, the overdrive voltage is applied to the outer select gate lines SGD (outer) during a relatively short period, and the overdrive voltage is applied to the inner select gate lines SGD (inner) during a longer period.

Likewise, the output of the SGD_usel (inner) driver 43 and the output of the SGD_usel (outer) driver 74 are also different only in the overdrive period, the overdrive voltage is applied to the outer select gate lines SGD (outer) during a relatively short period, and the overdrive voltage is applied to the inner select gate lines SGD (inner) during a longer period.

As illustrated in FIG. 20, the overdrive voltage is applied to the outer select gate lines SGD (outer) during a relatively short period, and the overdrive voltage is applied to the inner select gate lines SGD (inner) during a longer period. As a result, the resistance value of the outer select gate lines SGD (outer) is low, and thus the target voltage is reached relatively early. However, the overdrive period is short, and overshooting does not occur. In addition, the overdrive voltage is applied to the inner select gate lines SGD (inner) during a long period, and the target voltage is reached within a relatively short period of time.

In the embodiment, the overdrive period of the outer select gate lines SGD (outer) and the overdrive period of the inner select gate lines SGD (inner) are different from each other. As a result, while preventing the occurrence of overshooting in the outer select gate lines SGD (outer), the voltages of the outer select gate lines SGD (outer) and the inner select gate lines SGD (inner) can be made to reach the target voltage with a relatively high speed.

In the description of the embodiment, the examples in which the overdrive periods are different from each other are illustrated. The overdrive voltage value of the outer select gate lines SGD (outer) and the overdrive voltage value of the inner select gate lines SGD (inner) may be different from each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a substrate having a surface extending in a first direction and in a second direction crossing the first direction;
   a first memory cell provided on one side of the substrate in a third direction crossing the first direction and the second direction;
   a first select transistor electrically connected to the first memory cell and provided on one side of the first memory cell in the third direction;
   a second memory cell provided on the one side of the substrate in the third direction;
   a second select transistor electrically connected to the second memory cell and provided on one side of the second memory cell in the third direction;

a first word line extending in the first direction and connected to a gate of the first memory cell and a gate of the second memory cell;
a first select gate line extending in the first direction and connected to a gate of the first select transistor;
a second select gate line extending in the first direction and connected to a gate of the second select transistor;
a first bit line electrically connected to the first select gate transistor and the second select gate transistor;
a voltage generation circuit configured to independently drive the first select gate line and the second select gate line; and
a sequencer configured to perform a first read operation to read data from the first memory cell and a second read operation to read data from the second memory cell, wherein
in the first read operation, the voltage generation circuit applies a first voltage to the first word line, applies a second voltage to the first select gate line, and applies a third voltage to the second select gate line, and
in the second read operation, the voltage generation circuit applies a fourth voltage to the first word line, applies a fifth voltage to the first select gate line, and applies a sixth voltage, which is different from the second voltage, to the second select gate line.

2. The semiconductor memory device according to claim 1, wherein
an increase rate of the second voltage in the first read operation and an increase rate of the sixth voltage in the second operation are different.

3. The semiconductor memory device according to claim 2, wherein
the voltage generation circuit includes a first driver configured to supply a voltage to the first select gate line, and a second driver configured to supply a voltage to the second select gate line, and
a resistance value of a voltage supply path of the first driver is higher than a resistance value of a voltage supply path of the second driver.

4. The semiconductor memory device according to claim 1, wherein
an application period of an overdrive voltage of the second voltage in the first read operation and an application period of an overdrive voltage of the sixth voltage in the second operation are different.

5. The semiconductor memory device according to claim 4, wherein
the voltage generation circuit includes a first voltage generation circuit configured to generate a voltage that is supplied to the first select gate line, and a second voltage generation circuit configured to generate a voltage that is supplied to the second select gate line, and
the application period of the overdrive voltage of the first voltage generation circuit is shorter than the application period of the second voltage generation circuit.

6. The semiconductor memory device according to claim 1, wherein
the first voltage is the same as the fourth voltage, and
the third voltage is higher than the fifth voltage, and the sixth voltage is higher than the second voltage.

7. The semiconductor memory device according to claim 1, further comprising:
a first transfer switch having one end connected to the first word line;
a second transfer switch having one end connected to the first select gate line;
a third transfer switch having one end connected to the second select gate line;
a first electric line connected to the other end of the first transfer switch;
a second electric line connected to the other end of the second transfer switch; and
a third electric line connected to the other end of the third transfer switch, wherein
in the first read operation, the voltage generation circuit applies the first voltage to the first word line via the first electric line and the first transfer switch, applies the second voltage to the first select gate line via the second electric line and the second transfer switch, and applies the third voltage to the second select gate line via the third electric line and the third transfer switch, and
in the second read operation, the voltage generation circuit applies the fourth voltage to the first word line via the first electric line and the first transfer switch, applies the fifth voltage to the first select gate line via the second electric line and the second transfer switch, and applies the sixth voltage to the second select gate line via the third electric line and the third transfer switch.

8. The semiconductor memory device according to claim 1, wherein the first select gate line has one side in the second direction extending straight along the first direction and the other side in the second direction meandering along the first direction, and the second select gate line has one side in the second direction meandering along the first direction and the other side in the second direction meandering along the first direction.

9. The semiconductor memory device according to claim 1, further comprising:
a third memory cell provided on the one side of the substrate in the third direction, the third memory cell having a gate connected to the first word line;
a third select transistor electrically connected to the third memory cell and provided on one side of the third memory cell in the third direction;
a fourth memory cell provided on the one side of the substrate in the third direction, the fourth memory cell having a gate connected to the first word line;
a fourth select transistor electrically connected to the third memory cell and provided on one side of the fourth memory cell in the third direction;
a third select gate line extending in the first direction and connected to a gate of the third select transistor;
a fourth select gate line extending in the first direction and connected to a gate of the fourth select transistor, wherein the second select gate line and the third select gate line are provided between the first select gate line and the fourth select gate line in the second direction, and wherein
in the first read operation, the voltage generation circuit applies the third voltage to the third select gate line, and applies a seventh voltage, which is different from the second voltage, to the fourth select gate line, and
in the second read operation, the voltage generation circuit applies the fifth voltage to the fourth select gate line, and applies an eighth voltage, which is different from the sixth voltage, to the third select gate line.

10. The semiconductor memory device according to claim 9, wherein:
the first select gate line has one side in the second direction extending straight along the first direction and the other side in the second direction meandering along the first direction;

the second select gate line has one side in the second direction meandering along the first direction and the other side in the second direction meandering along the first direction;

the third select gate line has one side in the second direction meandering along the first direction and the other side in the second direction meandering along the first direction; and the fourth select gate line has one side in the second direction meandering along the first direction and the other side in the second direction extending straight along the first direction.

11. The semiconductor memory device according to claim 10, further comprising:

a fifth memory cell electrically connected to the first memory cell in the third direction;

a sixth memory cell electrically connected to the second memory cell in the third direction;

a seventh memory cell electrically connected to the third memory cell in the third direction;

an eighth memory cell electrically connected to the fourth memory cell in the third direction; and a second word line extending in the first direction and connected to a gate of the fifth memory cell, a gate of the sixth memory cell, a gate of the seventh memory cell, a gate of the eighth memory cell, wherein in the first read operation, the voltage generation circuit applies a ninth voltage to the second word line, and in the second read operation, the voltage generation circuit applies a tenth voltage, which is equal to the ninth voltage, to the second word line.

* * * * *